(12) United States Patent
Rottenberg et al.

(10) Patent No.: US 7,002,439 B2
(45) Date of Patent: Feb. 21, 2006

(54) SWITCHABLE CAPACITOR AND METHOD OF MAKING THE SAME

(75) Inventors: Xavier Rottenberg, Schaarbeek (BE); Henri Jansen, Enschede (NL); Hendrikus Tilmans, Maastricht (NL); Walter De Raedt, Edegem (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 113 days.

(21) Appl. No.: 10/663,340

(22) Filed: Sep. 15, 2003

(65) Prior Publication Data

US 2004/0124497 A1 Jul. 1, 2004

Related U.S. Application Data

(60) Provisional application No. 60/410,954, filed on Sep. 16, 2002.

(51) Int. Cl.
H01G 23/00 (2006.01)

(52) U.S. Cl. .................. 333/262; 257/415; 257/418; 257/532; 333/101; 333/105

(58) Field of Classification Search ............... 257/415, 257/418, 532; 333/101, 105, 262
See application file for complete search history.

(56) References Cited

U.S. PATENT DOCUMENTS

| | | | |
|---|---|---|---|
| 4,211,488 A | 7/1980 | Kleinknecht | |
| 6,160,230 A * | 12/2000 | McMillan et al. | ........... 200/181 |
| 6,307,452 B1 * | 10/2001 | Sun | .............. 333/262 |
| 6,323,951 B1 | 11/2001 | Borden et al. | |
| 6,472,962 B1 * | 10/2002 | Guo et al. | ................... 333/262 |
| 2002/0025595 A1 * | 2/2002 | Xu et al. | ....................... 438/48 |
| 2002/0027660 A1 | 3/2002 | Borden et al. | |
| 2002/0085211 A1 | 7/2002 | Borden et al. | |
| 2003/0043382 A1 | 3/2003 | Borden et al. | |

FOREIGN PATENT DOCUMENTS

WO    WO 02/01584 A1    1/2002

OTHER PUBLICATIONS

Muldavin, et al., "High-isolation CPW MEMS shunt switches-Part 1: Modeling", IEEE Transactions on Microwave Theory and Techniques, vol. 48, No. 6, pp. 1045-1052, (Jun. 2000).

Nguyen, et al., "Micromachined devices for wireless communications", Proceedings of IEEE, vol. 86, No. 8, pp. 1756-1768, (Aug. 1998).

Rebeiz, et al., "RF MEMS switches and switch circuits", IEEE Microwave Magazine, pp. 59-71, (Dec. 2001).

Tilmans, et al., "Wafer-level packaged RF-MEMS switches fabricated in a CMOS fab", IEEE, pp. 921-924, (2001).

(Continued)

Primary Examiner—David Nelms
Assistant Examiner—Dao H. Nguyen
(74) Attorney, Agent, or Firm—Knobbe Martens Olson & Bear LLP

(57) ABSTRACT

A micro electromechanical switchable capacitor is disclosed, comprising a substrate, a bottom electrode, a dielectric layer deposited on at least part of said bottom electrode, a conductive floating electrode deposited on at least part of said dielectric layer, an armature positioned proximate to the floating electrode and a first actuation area in order to stabilize the down state position of the armature. The device may furthermore comprise a second actuation area. The present invention provides shunt switches and series switches with actuation in zones attached to the floating electrode area or with relay actuation.

19 Claims, 14 Drawing Sheets

OTHER PUBLICATIONS

Yao, et al., "Micromachined low-loss microwave switches", IEEE Journal of Microelectromechanical Systems, vol. 8, No. 2, (Jun. 1999).

Yao, J. Jason, "Topical Review: RF MEMS from a device perspective", J. Micromech. Microeng., vol. 10, pp. R9-R38, (2000).

* cited by examiner

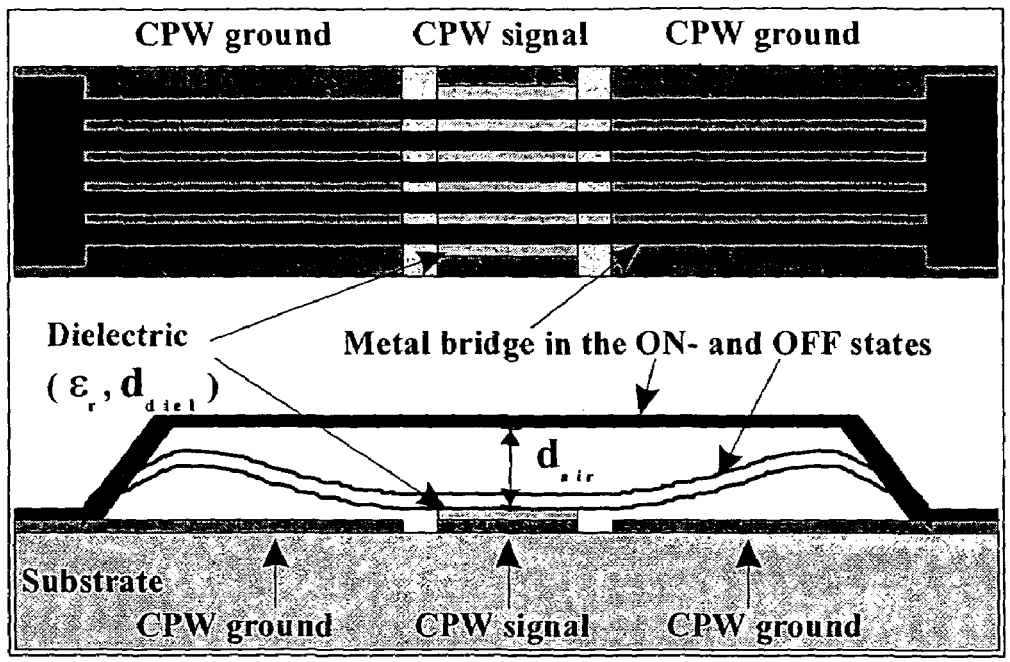
Fig. 1 – PRIOR ART
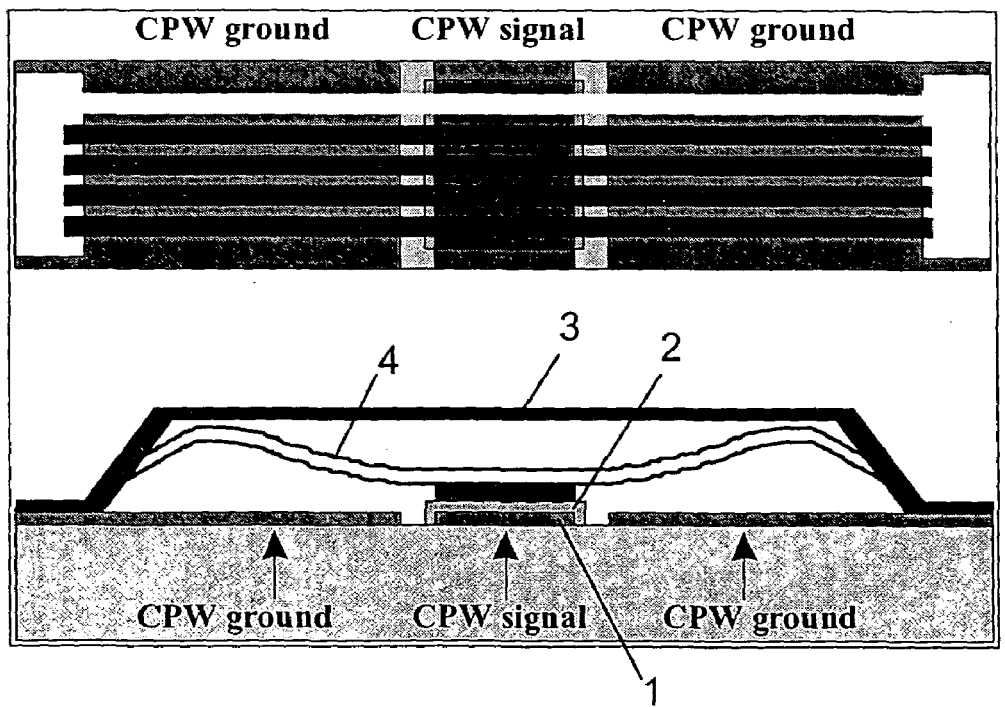
Fig. 2 – PRIOR ART

SWITCHABLE CAPACITOR AND METHOD OF MAKING THE SAME

RELATED APPLICATIONS

This application claims priority to, and hereby incorporates by reference the entire, co-pending U.S. Provisional Application No. 60/410,954 entitled "Switchable Capacitor", filed on Sep. 16, 2002.

BACKGROUND OF THE INVENTION

1. Field of the Invention

The present invention relates to electronic devices, especially micro electromechanical (MEMS) devices and method of making the same. In particular the present invention relates to the field of radio frequency MEMS and more particularly the present invention relates to MEMS near-DC to RF capacitive shunt and series switches, e. g. a switchable capacitor.

2. Description of the Related Art

RF-MEMS switches offer great potential benefits over GaAs MMICs and PIN (positive intrinsic negative) diode switches for application in wireless communication systems as described by C. T. C. Nguyen, et al. , in "*Micromachined devices for wireless communications*", Proc. of the IEEE, vol. 86(8), 1998, pp. 1756–1768; by J. J. Yao, in "*RF MEMS from a device perspective*", J. Micromech. Microeng., vol. 10(4), December 2000, pp. R9–R38; and by G. M. Rebeiz and J. B. Muldavin, in "*RF MEMS switches and switch circuits*", IEEE Microwave magazine, December 2001, pp. 59–71, each of which is incorporated herein by reference in its entirety. Prototype RF-MEMS switches display low loss (<0.4 dB), good isolation (>20 dB), low standby power consumption, excellent linearity (IP3>66 dBm), compactness and high levels of integration as discussed by J. J. Yao, in "*RF MEMS from a device perspective*", J. Micromech. Microeng., vol. 10(4), December 2000, pp. R9–R38; by G. M. Rebeiz and J. B. Muldavin, in "*RF MEMS switches and switch circuits*", IEEE Microwave magazine, December 2001, pp. 59–71; by Z. J. Yao, et al.in "*Micromachined low-loss microwave switches*", IEEE J. of MEMS, vol. 8(2), 1999, pp. 129–134; by J. B. Muldavin and G. M. Rebeiz, in "*High-isolation CPW MEMS shunt switches-Part 1: Modeling*", IEEE Trans. Microwave Theory and Techniques, vol. 48(6), 2000, pp. 1045–1052; and by H. A. C. Tilmans, et al., in "*Wafer-level packaged RF-MEMS switches fabricated in a CMOS fab*", proc. IEDM 2001, Washington, D.C., Dec. 3–5, 2001, pp. 921–924, each of which is incorporated herein by reference in its entirety.

A typical build-up of a RF-MEMS capacitive switch in a shunt configuration implemented on a CPW (CoPlanar Waveguide) line is shown in FIG. 1 and has been discussed by Z. J. Yao, et al. , in "*Micromachined low-loss microwave switches*", IEEE J. of MEMS, vol. 8(2), 1999, pp. 129–134; by J. B. Muldavin and G. M. Rebeiz, in "*High-isolation CPW MEMS shunt switches-Part 1: Modeling*", IEEE Trans. Microwave Theory and Techniques, vol. 48(6), 2000, pp. 1045–1052; and by H. A. C. Tilmans, et al., in "*Wafer-level packaged RF-MEMS switches fabricated in a CMOS fab*", proc. IEDM 2001, Washington, D.C., Dec. 3–5, 2001, pp. 921–924, each of which is incorporated herein by reference in its entirety. The switch comprises a suspended movable metal bridge, which is mechanically anchored and electrically connected to the ground of the CPW.

To a first order, the switch can be modeled as a capacitor between the metal bridge and the signal line. In the RF-ON state the bridge is up, hence the switch capacitance is small, hardly affecting the impedance of the line. By applying a DC bias (superimposed on the RF signal) the bridge is pulled down onto the dielectric, the switch capacitance becomes high and the switch is OFF or in the isolation state. An important figure of merit quantifying the RF performance is the down/up capacitance ratio, $C_{down}/C_{up}$, which is preferably as high as possible. This ratio can be approximated by $$\frac{C_{down}}{C_{up}} \approx \frac{\varepsilon_0 \varepsilon_r \frac{A_{overlap}}{d_{diel}}}{\varepsilon_0 \frac{A_{overlap}}{d_{air}}} = \varepsilon_r \frac{d_{air}}{d_{diel}} \qquad (\text{eq. 1})$$

where $d_{air}$ and $d_{diel}$ are the thickness of the air gap and the dielectric, respectively, $\varepsilon_r$ is the dielectric constant of the dielectric and $A_{overlap}$ is the overlap area of the bridge and the signal line. For a given technology, as $A_{overlap}$ cancels in (eq. 1), the isolation determines the insertion loss and vice versa. The design freedom is thus constrained considerably.

A second problem encountered in capacitive switches of the type shown in FIG. 1 is the degradation of the effective down capacitance as a result of surface roughness preventing intimate contact between the beam and the dielectric, which is discussed by J. B. Muldavin and G. M. Rebeiz in "*High-isolation CPW MEMS shunt switches-Part 1: Modeling*", IEEE Trans. Microwave Theory and Techniques, vol. 48(6), 2000, pp. 1045–1052. Solutions commonly pursued to attain a large down capacitance are aimed at keeping the roughness of the bridge and of the dielectric layer very low, e. g., <5 nm, and to keep the surface free from residues. Muldavin et al. and Yao et al. introduced thin bottom metals in an attempt to reduce the roughness. In particular, Z. J. Yao et al. described in "*Micromachined low-loss microwave switches*", IEEE J. of MEMS, vol. 8(2), 1999, pp. 129–134, the use of a thin refractory metal layer (e. g., W). All these measures however lead to a high series resistance and hence to an increased insertion loss for a shunt switch. Obviously, in a standard design as the one shown in FIG. 1, a difficult compromise must be made as measures for improving the isolation directly lead to a deterioration of the insertion loss.

In PCT patent application WO 02/01584, "Capacitive Micro electromechanical switches" by R. York et al., a micro electromechanical switch (FIG. 2) is disclosed comprising a bottom electrode 1, a dielectric layer 2 disposed on the bottom electrode 1, a metal cap (not shown) disposed on the dielectric layer 2 and a bridge 3 disposed proximate to the metal cap such that an electrical potential applied between the bridge 3 and bottom electrode 1 causes the bridge 3 to deform and contact the metal cap. The deformed bridge is depicted with reference number 4. A problem with this device is that charging of the metal cap will reduce the force exercised on the bridge 3, which might bounce back into the original position, hereby disturbing the normal working of the switch.

SUMMARY OF THE INVENTION

It is an object of the present invention is to provide an electronic device and method of manufacture of the same which a) has an acceptable insertion loss, and/or b) do not require ultra-smooth surfaces and/or c) do not have an unacceptable bounce back.

The present invention is applicable in the field of switchable capacitors and capacitive switches. The present invention provides a micro electromechanical switchable capacitor, a shunt switch or a series switch (corresponding to bridge and cantilever) with relay actuation or actuation in zones attached to a floating electrode area.

In a first aspect of the invention a micro electromechanical switchable capacitor is disclosed, comprising a substrate, a bottom electrode, a dielectric layer deposited on at least part of the bottom electrode, a conductive floating electrode deposited on at least part of the dielectric layer, an armature positioned proximate to the floating electrode so as to form an overlap with the floating electrode, the overlap being defined by projection of the armature onto the floating electrode along a direction substantially perpendicular to the plane of the bottom electrode. Furthermore, the switchable capacitor of the present invention comprises a first actuation area, which is defined by a part of an overlap between the armature and the bottom electrode which is not covered by the floating electrode, the overlap between the armature and the bottom electrode being defined by projection of the armature onto the bottom electrode along a direction substantially perpendicular to the bottom electrode. An advantage of the device of the present invention is that, because of the first actuation area, the armature remains in the down state position after touching the floating electrode.

In a preferred embodiment the switchable capacitor of the present invention may furthermore comprise at least one actuation electrode and a second actuation area, which second actuation area may be defined by an overlap between the armature and the at least one actuation electrode, the overlap being defined by projection of the armature onto the bottom electrode in a direction substantially perpendicular to the plane of the bottom electrode. Through the presence of the second actuation area, stability of the down state position of the armature is increased.

In one embodiment of the present invention, the overlap between the floating electrode and the armature, which overlap is defined by projection of the armature onto the floating electrode in a direction substantially perpendicular to the plane of the bottom electrode, may be made as small as possible in order to decrease the up state capacitance and hence increase the down/up capacitance ratio.

The capacitor comprises a first and a second side opposite to each other in a plane substantially parallel to the plane of the bottom electrode. The armature may be located such that a first portion of the floating electrode is positioned at the first side of the armature and a second portion of the floating electrode is positioned at the second side of the armature.

In the present invention, the armature may be a bridge or a cantilever.

An up state actuation area may be defined by the overlap between the armature and the bottom electrode and/or by the second actuation area.

A down state actuation area may be defined by the first actuation area and/or by the second actuation area.

In another embodiment of the present invention, $C_{up}$ may be defined as the up state capacitance which may be a function of the overlap area between the armature and the bottom electrode. In a further embodiment the up state capacitance may be proportional with the overlap between the armature and the bottom electrode.

In yet another embodiment the up state capacitance may be made as low as possible, in order to increase the down/up capacitance ratio, by reducing the overlap between the armature and the bottom electrode.

In an embodiment of the present invention, $C_{down}$ may be defined as the down state capacitance which may be a function of the overlap area between the floating electrode and the bottom electrode, which overlap may be defined by projection of the floating electrode onto the bottom electrode according to a direction substantially perpendicular to the plane of the bottom electrode. In a further embodiment the down state capacitance may be proportional with the overlap between the floating electrode and the bottom electrode.

In an embodiment of the present invention the floating electrode may comprise two or more unconnected regions. In another embodiment of the present invention, each of the unconnected regions may have an overlap with the armature, the overlap being defined by projection of the armature onto the unconnected regions of the floating electrode according to a direction substantially perpendicular to the plane of the bottom electrode.

In a further embodiment of the present invention at least one superincumbent island of conductive material may be deposited on the floating electrode. The at least one superincumbent island functions as a contactor between the armature and the floating electrode.

In an embodiment of the present invention, the armature, comprising an up and down surface positioned opposite of each other in a plane substantially perpendicular to the plane of the bottom electrode, may comprise on its down surface at least one superincumbent island of conductive material. The at least one superincumbent island functions as contactor between the armature and the floating electrode.

In a further embodiment of the present invention the floating electrode may be embedded or encapsulated in the dielectric layer.

In another embodiment of the present invention the dielectric layer may comprise holes. In still another embodiment the floating electrode may comprise holes. In yet another embodiment the armature may comprise holes.

The present invention also provides a method for processing a micro electromechanical switchable capacitor, the method comprising: depositing of a stack comprising a first conductive layer, a second conductive layer and a first dielectric layer in between said first and said second conductive layer, etching said second conductive layer and said first dielectric layer using a first mask, so as to define a region of the first conductive layer that is protected by the first mask, etching said second conductive layer using a second mask, so as to form a floating electrode and a first actuation area, etching said first conductive layer using a third mask, so as to form a bottom electrode and ground lines, and depositing and etching a third conductive layer so as to form an armature.

The method may further comprise depositing and patterning a sacrificial layer before depositing the third conductive layer, and etching said sacrificial layer so as to release said armature. The method may furthermore comprise:

depositing a second dielectric material, and etching said second dielectric material and said first conductive layer so as to form actuation electrodes. The armature can be a bridge or cantilever. The method may furthermore comprise depositing at least one superincumbent island onto said floating electrode. Holes may be provided in said dielectric layer and/or in said floating electrode and/or in said armature.

An advantage of the present invention is that by modifying the geometry of the device of the present invention, it is possible to increase the down/up capacitance ratio, which ratio is an important feature of a switchable capacitor.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 1 shows a prior art RF-MEMS capacitive shunt switch.

FIG. 2 illustrates another prior art MEMS capacitive switch.

FIG. 12 is a schematic representation of the device of an embodiment of the present invention.

DETAILED DESCRIPTION OF THE INVENTION

Figure 3:
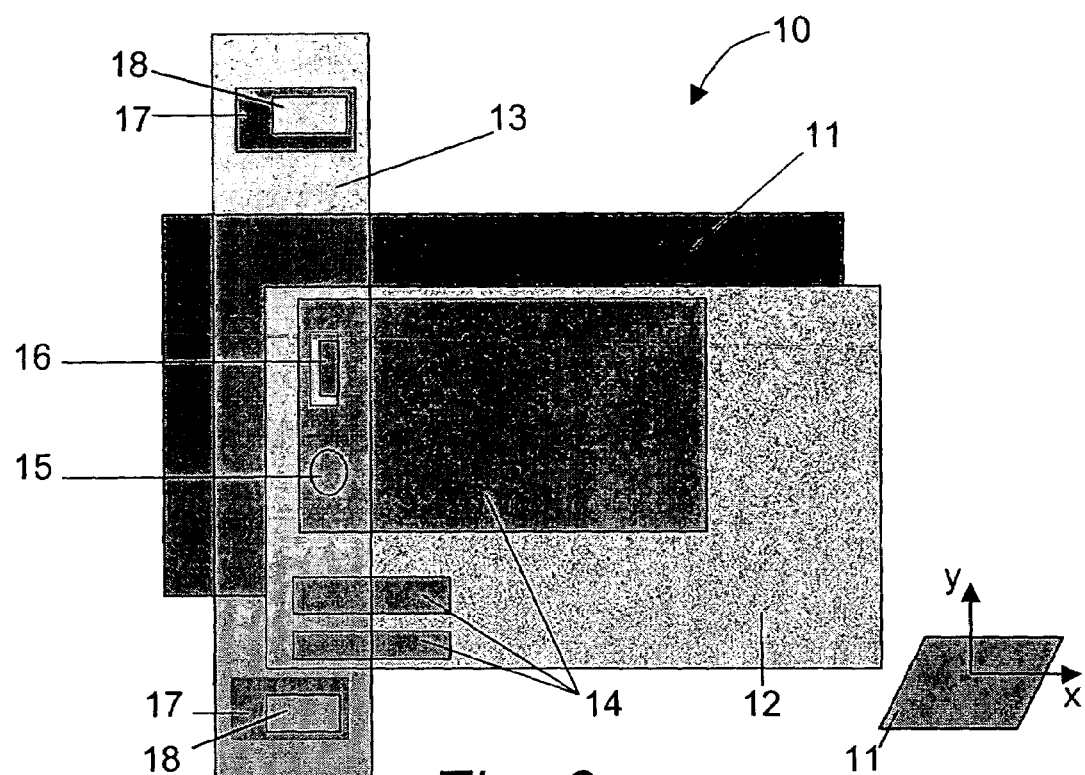
FIGS. 3, 4, 5, 6, 7, 8, 9, 10, 11, 12 and 11 illustrate various relevant parts of an embodiment of the present invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

The present invention provides embodiments for shunt switches and series switches which have corresponding features of a bridge and a cantilever respectively), with relay actuation or actuation in zones attached to the floating electrode area, and provides devices for application in the field of switchable capacitors and capacitive switches.

For the purpose of the description of the present invention, different relevant parts of the device are defined by reference to FIGS. 3–11, wherein different implementations of the present invention are illustrated. The relative dimensions of the different parts may be chosen as a function of the required working phase space and characteristics of the device, though preferred value ranges will be mentioned.

FIG. 3 shows a device 10 according to the invention formed onto a substrate, which may for example be, but is not limited to, glass, high resistive semiconductors, ceramic materials, or any low loss, non-conductive material. As used herein, "low loss" generally refers to a loss that is smaller than 1e-4. For clarity, the substrate is not depicted in FIG. 3 to FIG. 11.

In general the value of capacitance depends on the type of dielectric material used to insulate a capacitor. Air may act as a dielectric material for the purpose of this invention, though preferably in combination with another dielectric material that is providing support to a floating electrode. Furthermore, the dielectric material may also be provided by a vacuum layer.

FIGS. 3–11 illustrate the device 10 of the present invention, showing the following parts. A bottom electrode 11, which may be in a coplanar waveguide (CPW) line corresponding to a signal line (not shown in FIGS. 3–11), may comprise a conductive material such as for example a metal, a semiconductor material or a conductive polymer. In addition to a CPW geometry, any suitable signal feeding system may be used, e. g., microstrip, stripline or CPW with grounded backside geometries. The bottom electrode 11 may be produced using suitable techniques for the deposition of a conductive material such as for instance, but not limited to, sputtering, plating, printing or spincoating. The thickness of the bottom electrode 11, as well as the ground lines present in some of the preferred embodiments of the invention, may be preferably between 0.1 $\mu$m and 10 $\mu$m, and more preferably the thickness of the bottom electrode 11 may be between 1 $\mu$m and 3 $\mu$m.

Furthermore, the device 10 of comprises a dielectric layer 12, which may comprise a dielectric material such as for example, but not limited to, inorganic ($SiO_2$, $Ta_2O_5$, $Si_3N_4$) or organic (polymer) materials. The dielectric layer 12 may have preferably a thickness between 0.01 $\mu$m and 100 $\mu$m. More preferably the dielectric layer 12 may have a thickness between 0.01 $\mu$m and 10 $\mu$m. Most preferably the dielectric layer 12 may have a thickness between 0.1 $\mu$m and 1 $\mu$m. In order to increase the down state capacitance, a thin dielectric layer 12 may be preferred over a thick one. The dielectric layer 12 may however not be too thin in order to avoid breakdown of the capacitor. Breakdown of the capacitor depends on the material used to form the dielectric layer 12 and on the applied voltage. Therefore, it is desirable to have a minimum allowable thickness to avoid breakdown of the capacitor depends on the material used to form the dielectric layer 12. Typical breakdown voltages are in the order of 1e8–1e9 volts per meter.

The dielectric layer 12 may be deposited onto at least a portion of the bottom electrode 11. Different processes may be used for producing the dielectric layer 12, which processes may comprise various steps, comprising but not limited to, steps as for example sputtering or PECVD. Furthermore, the dielectric layer 12 may include holes and may have different shapes and sizes. In this embodiment, the dielectric layer 12 may cover the overlap area between an armature 13 and the bottom electrode 11 partially (see FIG. 3) or completely (see FIG. 4), the overlap area being defined by the projection of the armature 13 onto the bottom electrode 11 along a direction substantially perpendicular to plane of the bottom electrode 11 (i. e. the y-direction, see FIGS. 3–4). The projection of the dielectric layer 12 along the y-direction onto the bottom electrode 11 may also be shifted in a direction parallel to the plane of the bottom electrode 11 (i. e. the x-direction, see FIGS. 3–4). The dielectric layer 12 may also extend under the armature 13 and the geometry may preferably be such that a first portion of the dielectric layer 12 is positioned at a first side of the armature 13 and a second portion of the dielectric layer 12 is positioned at a second side of the armature 13, the first and second portion of the armature 13 being positioned opposite to each other in a plane substantially perpendicular with the plane of the bottom electrode 11 (see FIG. 4).

In a next step, a floating electrode 14 is deposited onto at least part of the dielectric layer 12. The floating electrode 14 may comprise a conductive material such as for example a metal (e. g. Au, Al or Cu), a semiconductor material (e. g. Si, Ge or GeAs) or a conductive polymer. The floating electrode 14 may be deposited by different suitable techniques, such as for example plating, sputtering, printing or spincoating. Preferably a low temperature process may be used in order not to affect the earlier deposited layers. The maximum allowed temperature depends on the type of materials used to form the dielectric layer 12 and/or the bottom electrode 11 and preferably may be less than 350° C. or less than 250° C. The thickness of the floating electrode 14 may preferably be between 0.01 $\mu$m and 10 $\mu$m. More preferably the thickness of the floating electrode 14 may be between 0.1 $\mu$m and 2 $\mu$m. Most preferably the thickness of the floating electrode 14 may be between 0.1 $\mu$m and 0.3 $\mu$m.

Figure 4:
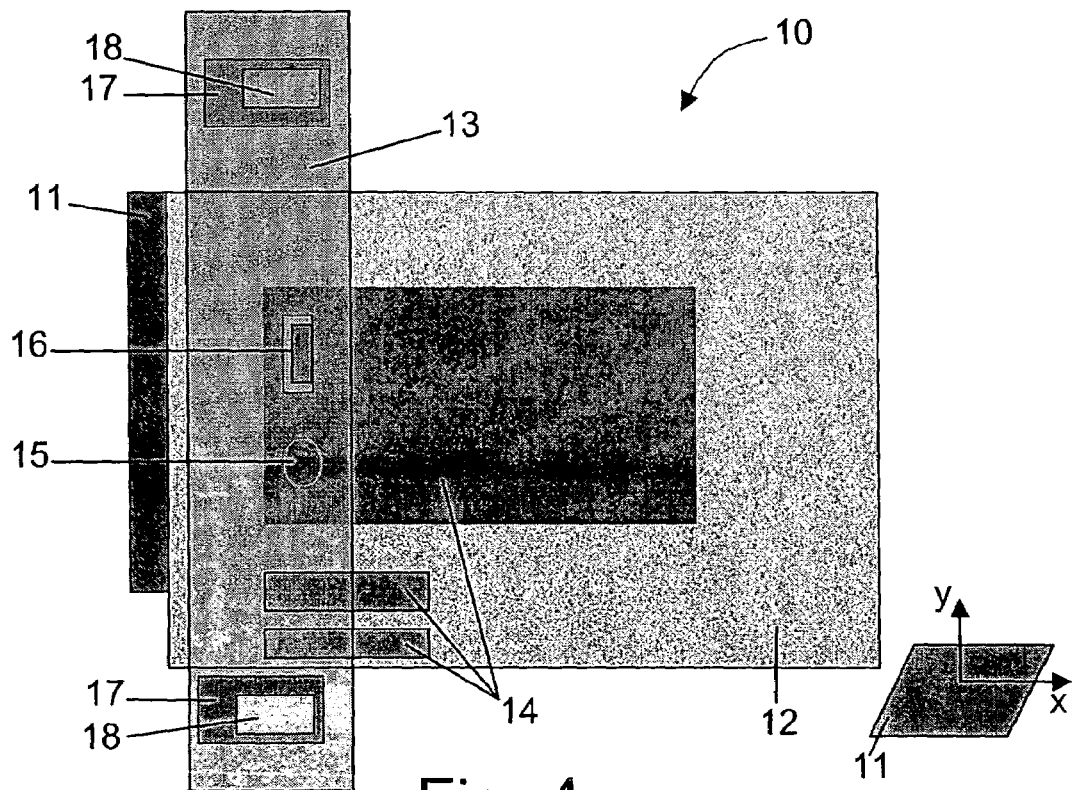

The floating electrode 14 may at least partially overlap with the armature 13 whereas the overlap between the armature 13 and the floating electrode 14 may be defined as the projection of the armature 13 onto the floating electrode 14 according to the y-direction (see FIGS. 3–4). The portion of the area situated under the armature 13, which is not covered by the floating electrode 14, may serve as an actuation area, and particularly a down state actuation area. The geometry may preferably be such that a first portion of the floating electrode 14 is positioned at a first side of the armature 13 and the bottom electrode 11 and a second portion of the floating electrode 14 is positioned at a second side of the armature 13 and the bottom electrode 11, the first and second side of the armature 13 and the bottom electrode 11 being positioned opposite to each other in a plane substantially perpendicular to the plane containing the bottom electrode 11. The floating electrode 14 may include holes 15 and 16, which may function as an actuation area if the holes 15,16 overlap with the armature 13. The holes 15,16 may either partially or completely overlap with the holes in the dielectric layer 12. In order to reduce stiction between the armature 13 and the floating electrode 14 in the down state, the surface of the floating electrode 14 may be made rough or patterned. The roughness of the surface of the floating electrode 14 may depend on the method of processing. Therefore, processing methods, which do not result in smooth surfaces, may be used to deposit the floating electrode 14. In another embodiment, the surface of the floating electrode 14 may be roughened may be by deposition of another conductive layer on top of the floating electrode by, for example, plating, sputtering, printing or spincoating. In order to reduce stiction and to reduce the distance between the armature 13 and the floating electrode 14, the floating electrode 14 may further comprise at least one elevated island (not shown in FIGS. 3 and 4) of conductive material such as for example a metal, a semiconductor material or a conductive polymer, whereby the island functions as a contact region between the armature 13 and the floating electrode 14.

On top of the foregoing structure, a sacrificial layer (not shown in FIGS. 3–11) may further be deposited on which, in a next step, the armature 13 may be formed. The sacrificial layer may for example be a polymer, such as for example BCB, polyimide or other suitable polymers used as photoresists in micorphotolithography and known to the skilled person. The thickness of the sacrificial layer determines the distance between the armature 13 and the floating electrode 14. Preferably the thickness of the sacrificial layer may be between 0.8 $\mu$m and 10 $\mu$m. More preferably the thickness may be between 1 $\mu$m and 5 $\mu$m. Most preferably the thickness of the sacrificial layer may be between 2 $\mu$m and 4 $\mu$m.

The armature 13, which may be deposited on top of the sacrificial layer by for example sputtering, plating, printing or spincoating, may comprise a conductive material such as a metal (Au, Al, Cu or other suitable metals), a semiconductor material (Si, Ge, GeAs), a conductive polymer or any other suitable conductive material. The armature 13 and the floating electrode 14 may for example comprise the same material. The armature 13 and the floating electrode 14 may, however, also comprise different materials. In the latter case, stiction between the armature 13 and the floating electrode 14 in the down state will be reduced. Openings in the armature 13 may be formed by for example an etching process. During the etching process the sacrificial layer may be removed.

Furthermore, in FIG. 3 and FIG. 4, actuation electrodes 17 are indicated. The actuation electrodes 17 may for example comprise a conductive material such as for example a metal, a semiconductor material or a conductive polymer, which may be different from the material of the bottom electrode 11 and the same of the material of the floating electrode 14, or which may, in another embodiment, both be different from the material of the bottom electrode 11 and different from the material of the floating electrode 14. Furthermore, an additional layer of dielectric material 18 may be deposited on top of at least some of the electrodes 14,17 in order to avoid direct contact with the armature 13 in the down state. The dielectric material 18 used to cover the different electrodes 14,17 may be different for each electrode 14,17.

Figure 5:
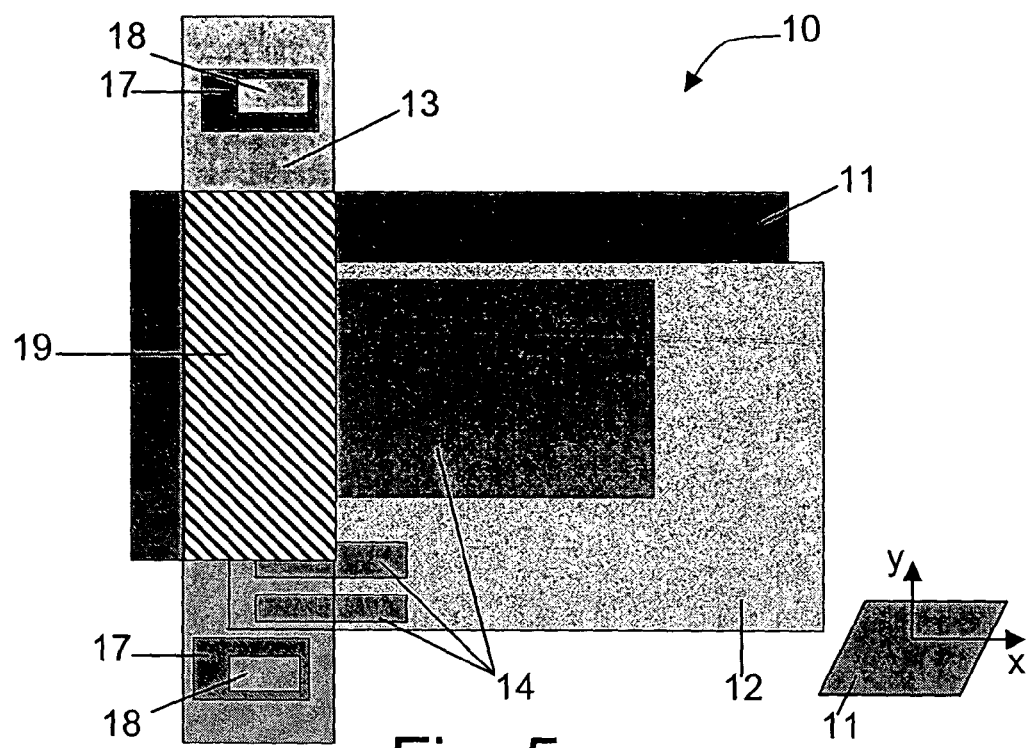
Figure 6:
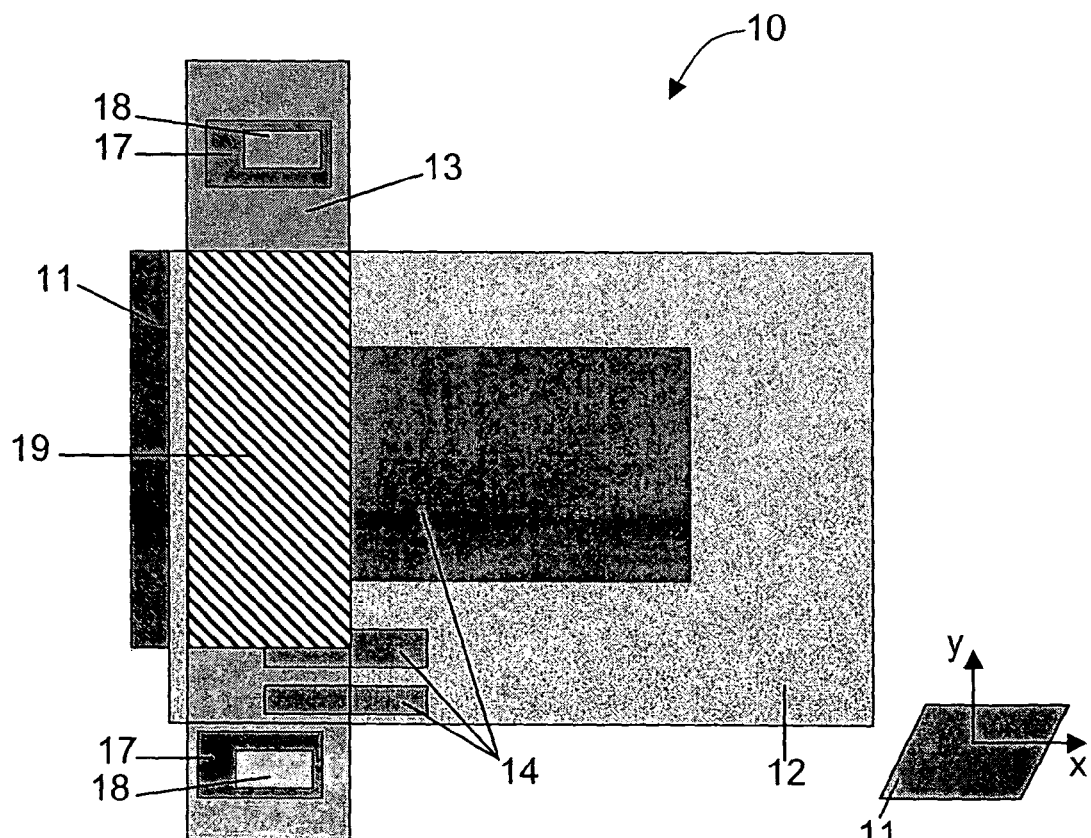
Figure 7:
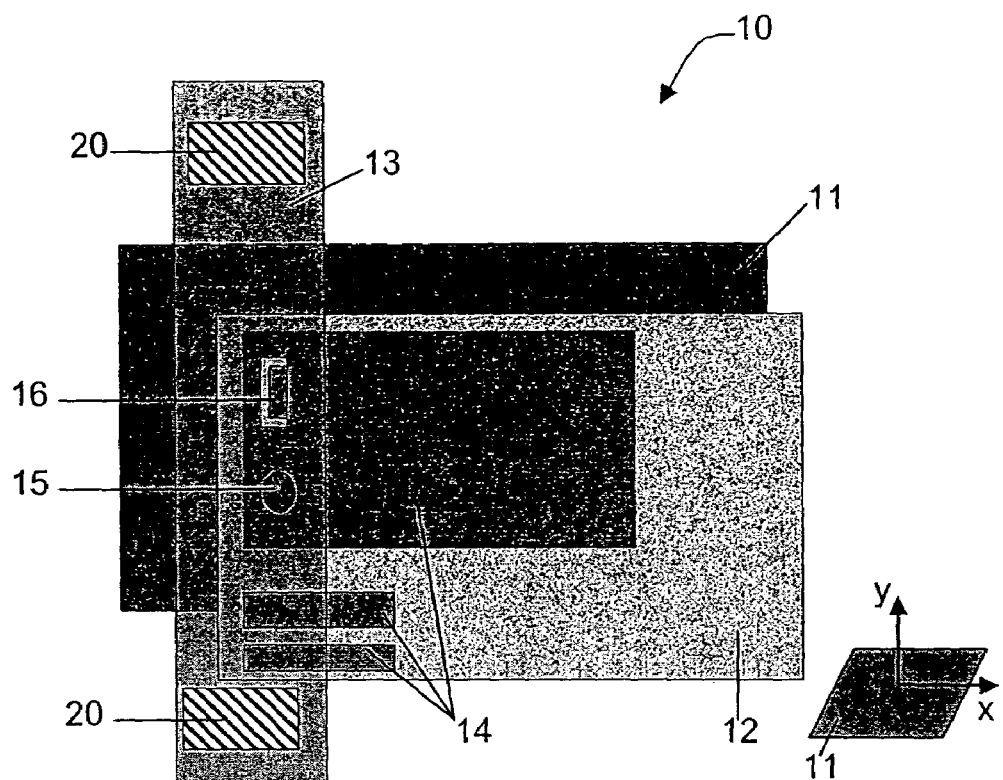
Figure 8:
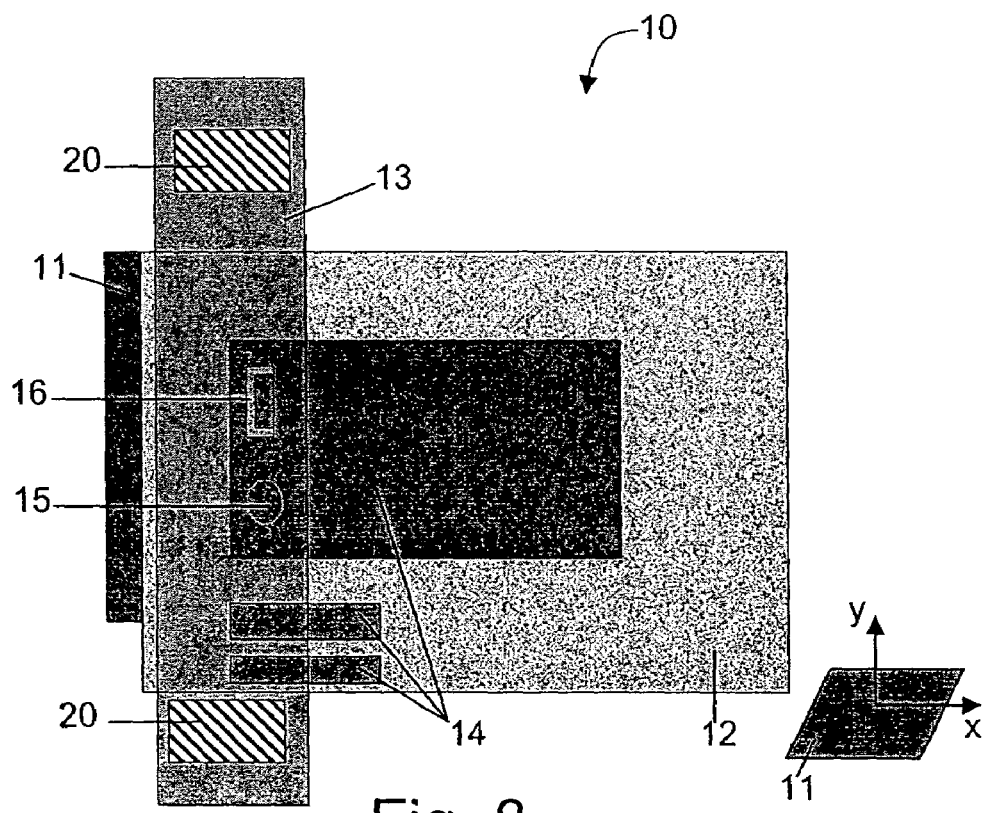

In FIG. 5 and FIG. 6, an up state actuation area 19, which may be extended if actuation electrodes 17 are present, is defined as the overlap between the armature 13 and the bottom electrode 11. The overlap is defined by the projection of the armature 13 onto the bottom electrode 11 according to a direction substantially perpendicular to the plane of the bottom electrode 11. The up state actuation area 19 may be extended by the area 20 of the actuation electrodes 17 as drawn in FIG. 7 and FIG. 8. The area 20 of the actuation electrodes 17 may also be contributed to the down state actuation area.

Figure 9:
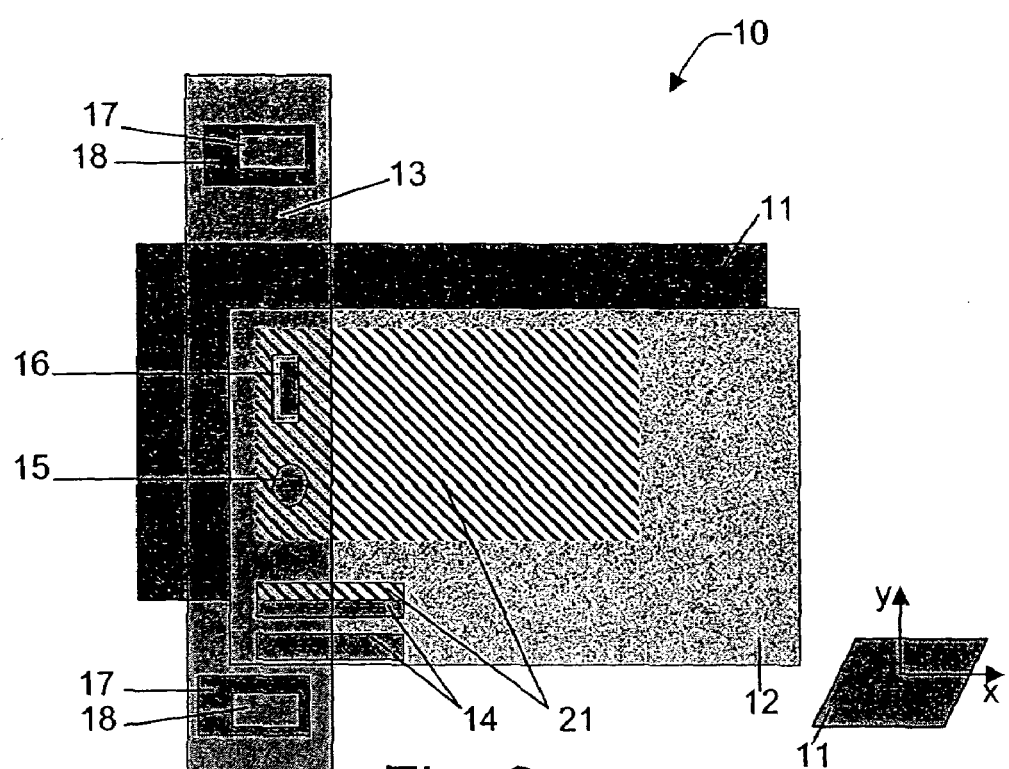
Figure 10:
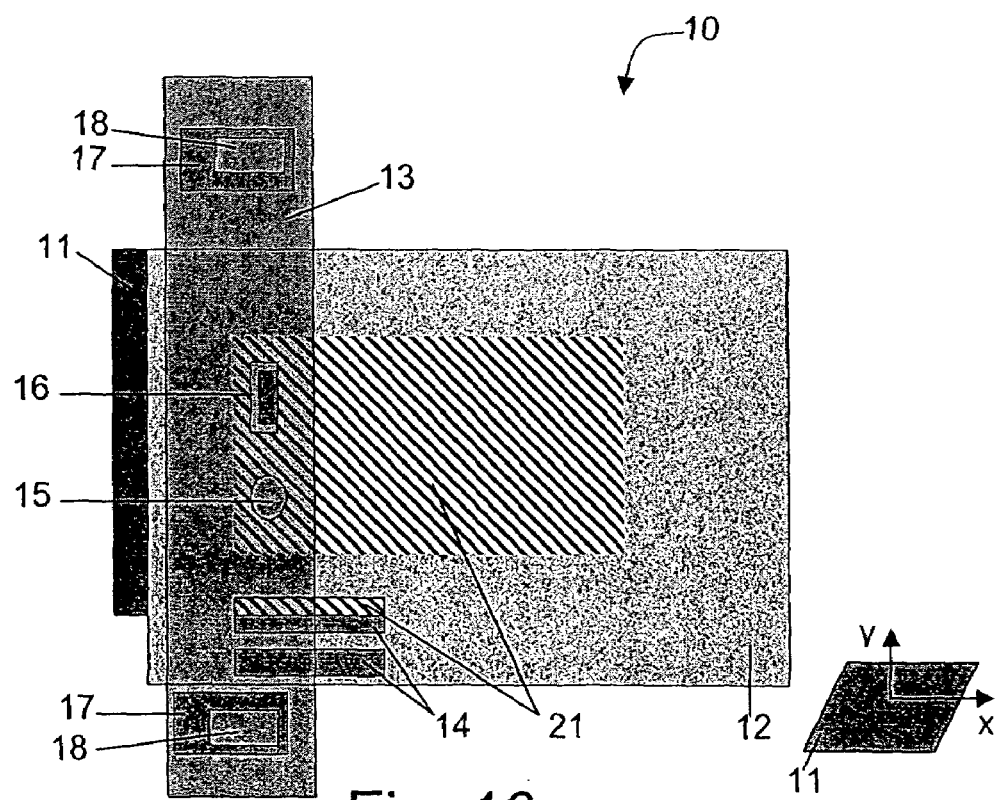
Figure 11:
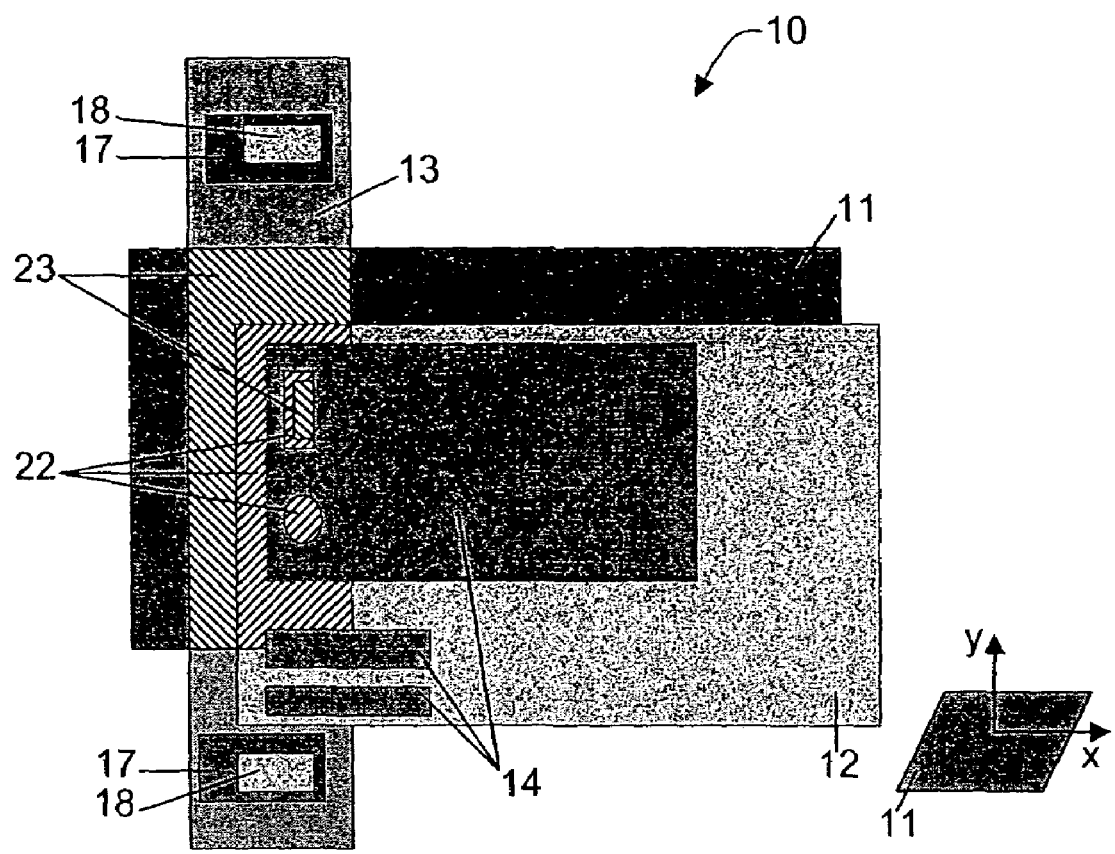

The up state capacitance is determined by the up state actuation areas 19 (see FIG. 5 and FIG. 6) while the down state capacitance is determined by the overlap 21 between the floating electrode 14 and bottom electrode 11 (see FIG. 9 and FIG. 10). The overlap 21 may be defined by the projection of the floating electrode 14 onto the bottom electrode 11 along a direction substantially perpendicular to the plane of the bottom electrode 11. Each of the total down state actuation area 22,23 may comprise a portion of the area situated under the armature 13 which is not covered by the floating electrode 14 (see FIG. 11). If actuation electrodes 17 are present, each down state actuation area may comprise also area 20 of the actuation electrodes 17. In area 23 no supporting dielectric material and no floating electrode 14 are present. This means that, the dielectric material comprises simply air. In area 22 the dielectric material gives support to the floating electrode 14.

The actuation voltage to be applied between the armature 13 and up state actuation area 19 to cause the armature 13 to deform and contact the floating electrode 14 may preferably be between 1 V and 50 V or between −1 V and −50 V, but higher and lower values are not excluded. More preferably the voltage may between 4 V and 25 V or between −4 V and −25 V.

Figure 12:
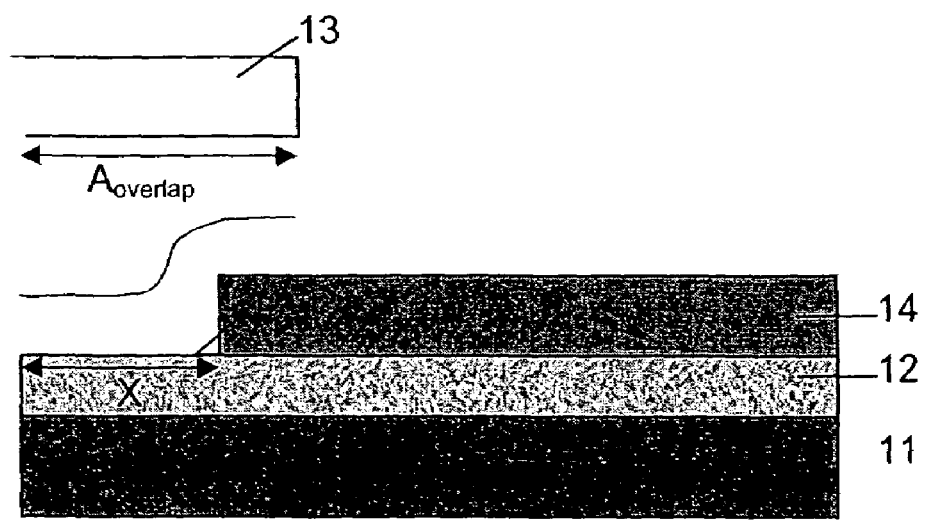

As already discussed above, the down/up capacitance ratio, $C_{down}/C_{up}$, which is preferably as high as possible, is quite relevant to quantifying the RF performance of a switch capacitance. FIG. 12 shows a schematic view of a device 10 according to one embodiment of the invention, and illustrates deriving the down/up capacitance ratio without limiting the present invention to said embodiment. The down capacitance may be defined by $$C_{down} = \varepsilon_0 \varepsilon_r \frac{X}{d_{diel}} + \varepsilon_0 \varepsilon_r \frac{A_{float}}{d_{diel}} \quad \text{(eq. 2)}$$

wherein $A_{float}$ is the overlap between the armature 13 and a signal line. The up state capacitance may be defined by $$C_{up} = \varepsilon_0 \frac{A_{overlap}}{d_{air}} \quad \text{(eq. 3)}$$

By dividing (eq. 2) by (eq. 3) the down/up capacitance ratio may be determined as $$\frac{C_{down}}{C_{up}} = \varepsilon_r \frac{X \cdot d_{air}}{A_{overlap} \cdot d_{diel}} + \varepsilon_r \frac{d_{air}}{d_{diel}} \frac{A_{float}}{A_{overlap}} \quad \text{(eq. 4)}$$

The first term of (eq. 4) may often be neglected because $\in_r$ is negligible as there exists no good contact between the armature 13 and the dielectric layer 12. The down/up capacitance ration may then be defined by $$\frac{C_{down}}{C_{up}} = \varepsilon_r \frac{d_{air}}{d_{diel}} \frac{A_{float}}{A_{overlap}} \quad \text{(eq. 5)}$$

The above equation (eq. 5) differs from the equation derived for the switch capacitance of the prior art (eq. 1) by the factor $(A_{float}/A_{overlap})$, which is called the geometrical factor. By modifying this geometrical factor, i. e. by changing $A_{float}$ and/or $A_{overlap}$ and hence modifying the geometry of the device 10, it is possible to reach a large capacitance ratio. For example, for the device 10 of the present invention, a capacitance ratio of more than 600 may be achieved. Using (eq. 5), the down/up capacitance ratio may be increased by either increasing the area of the floating electrode 14 ($A_{float}$) or decreasing the overlap between the armature 13 and the signal line ($A_{overlap}$) or by both increasing $A_{float}$ and decreasing $A_{overlap}$.

As the capacitance ratio was a limiting factor, the present invention advantageously allows for the capacitance ratio to be a new variable of the device design. The capacitance ratio may be freely defined and precisely realized as it is defined by a contact with the top floating metal. The improvement may be especially desirable at low frequency, where the large down capacitance may be crucial. The device 10 of the present invention shows a separate dependence of up and down states, through which it becomes possible to improve one of the capacitances $C_{up}$ or $C_{down}$ without influence to the other one.

Whenever in the further description, the following embodiments and/or in the claims overlap between two parts of the device of the present invention is mentioned, overlap refers to the projection of the first portion of the device onto the second portion of the device along a direction substantially perpendicular to the plane of the bottom electrode 11.

Figure 13:
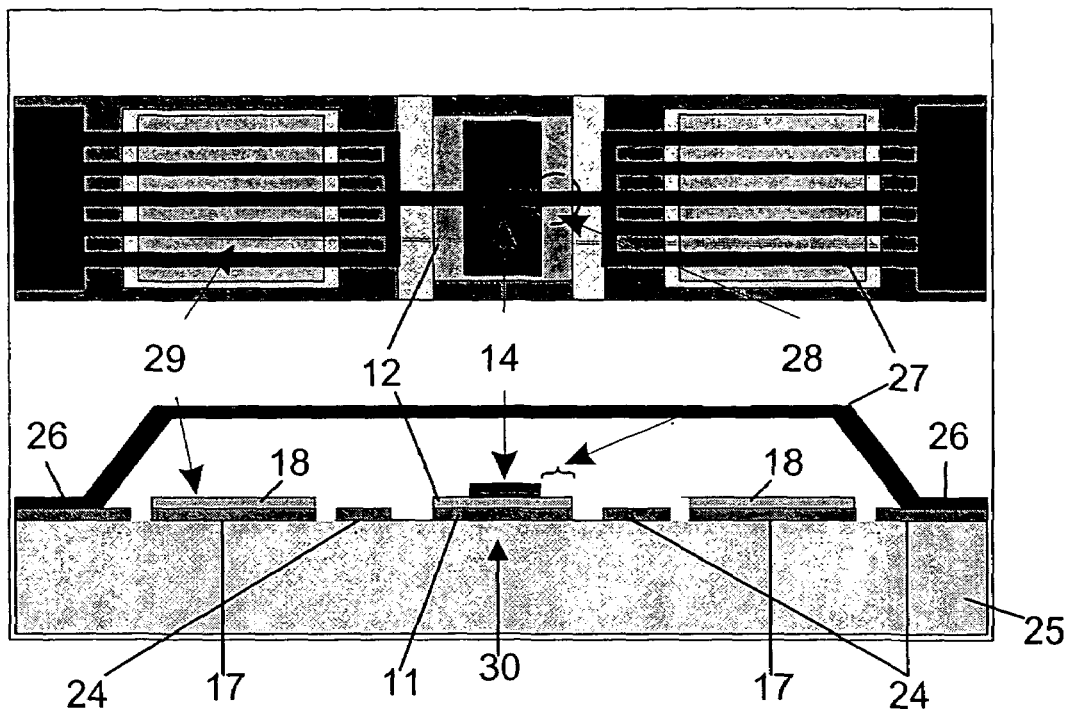
FIG. 13 shows an RF MEMS capacitive switch structure according to another embodiment of the invention.
Figure 14:
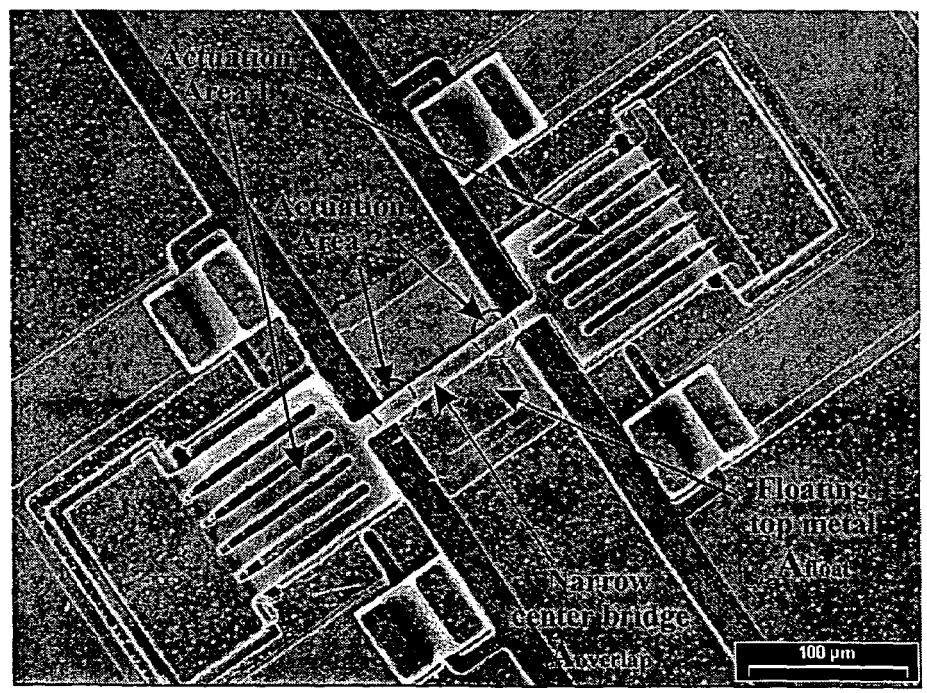
FIG. 14 is a SEM picture of the RF MEMS switching device of FIG. 13.

A preferred, but not limiting, embodiment of the present invention is shown in FIG. 13. A corresponding SEM picture of the device 10, fabricated according to this preferred embodiment, is shown in FIG. 14. In this preferred embodiment, CPW ground lines 24 are introduced between the bottom electrode 11 and actuation electrodes 17.

The processing of the device 10 according to this preferred embodiment of the present invention may be described as follows. A stack comprising a first conductive layer, a dielectric layer 12 and a second conductive layer is deposited onto a substrate 25. The first conductive layer may for example comprise a metal layer, such as Al or Cu, a semiconductor material, such as Si or Ge, or a conductive polymer. The first conductive layer may have a thickness of preferably 1 µm, but also conductive layers with another thickness, preferably between 0.1 µm and 10 µm, may be applied. From the first conductive layer, the bottom electrode 11 and CPW ground lines 24 are later formed. The dielectric layer 12 may comprise, for example, an inorganic (e. g. $Ta_2O_5$) or an organic (e.g., polymer) material and may preferably have a thickness between 0.01 µm 100 µm; for example the thickness may be 0.2 µm. The second conductive layer may for example be a metal layer such as Al or Cu, or a conductive polymer and may preferably have a thickness between 0.01 µm and 10 µm; for example the thickness may be 0.1 µm. The floating electrode 14 later is formed from this second conductive layer. For example, an AF45 glass substrate may be used as the substrate 25. Other suitable substrates may for example include, but are not limited to, glass, high resistive silicon or any low loss (or high resistive), non-conductive material.

A first mask is used to etch both the second conductive layer and the dielectric layer 12 to define where the first conductive layer has to be protected. A second mask is required to define the plate of the floating electrode 14. The 25/100/25 µm CPW ground lines 24 are defined using a third mask.

Next, a sacrificial layer, which may for example be a polymer such as e. g. PCB, polyimide or other suitable polymers used as photoresists in standard photolithography and which may preferably have a thickness between 0.8 µm and 10 µm, for example 3 µm, is spincoated and patterned to define the bridge anchors 26.

Furthermore, a third conductive layer, which may for example be a metal layer, such as e. g. Al or Cu, a semiconductor material, such as e. g. Ge or Si, or a conductive polymer, may for example be sputtered or spincoated onto the device 10 and may be etched defining the armature 13 which in this preferred embodiment may have the shape of a bridge 27. The third conductive layer may have a thickness of for example 1 µm. The bridge 27 may then be released in a final sacrificial layer plasma etch.

In this preferred embodiment, actuation electrodes 17 may be formed of the same conductive material as the bottom electrode 11. Furthermore, the dielectric material 18 on top of the actuation electrodes 17 may be the same as the dielectric material 18 covering the bottom electrode 11.

The concept of using the floating electrode 14 is to ensure that an optimal down capacitance may be achieved without having to resort to very smooth surfaces. A few ohmic contact points between the bridge 27 and the floating electrode 14 suffice to attain the optimal down capacitance given by (eq. 2). The use of a floating electrode 14 furthermore allows the use of a thick highly conductive, and thus low-loss first conductive layer. The only requirement is that the contact impedance between the bridge 27 and the floating electrode 14 (combination of contact resistance and capacitance due to a native oxide layer) is sufficiently low, e. g. lower than 10 mΩ, preferably lower than 1 mΩ, so as not to limit the best attainable isolation. By choosing a bridge 27 which is more narrow than the floating electrode 14, and hence reducing the overlap between the bridge 27 and the floating electrode 14, the up capacitance may be lowered without affecting the down capacitance. The overlap between the bridge 27 and the floating electrode 14 may be made as small as possible, e. g. smaller than for example 5 $\mu$m. This allows to further optimise the capacitance ratio.

The introduction of the floating electrode 14 requires modification of the actuation scheme of the standard switch of FIG. 1. Covering the dielectric layer 12 with a floating electrode may result in an unstable device 10 because, if a bias is applied, the bridge 27 pulls in but releases as soon as it touches the floating electrode 14. Upon contact, the floating electrode 14 and the bridge 27 have the same potential. In other words, the electrostatic attractive force vanishes. Such is the case of device of FIG. 2 wherein a metal cap is positioned onto the dielectric layer 2 in order to make contact with the bridge 3. When the bridge 3 touches the metal cap, the forces exercised on the bridge 3 are reduced because of charging of the metal cap.

Therefore, the structure shown in FIG. 13 and FIG. 14 provides actuation. This may be done in different ways which will be illustrated in the hereinafter described embodiments. In one embodiment the areas adjacent to the floating electrode 14, part of the switch capacitance and indicated as a first actuation area 28, are used. In another embodiment actuation is achieved by separate actuation electrodes 17 located in a second actuation area 29 adjacent to the signal line 30. In using the first actuation area 28 a capacitive switch may result with the exception that a floating electrode 14 is used. Using the second actuation area 29, the capacitive contact may be replaced by an ohmic contact.

Different embodiments of the present invention are represented schematically in FIGS. 15, 16, 17, 18, 19, 20, 21, 22, 23, and 24. In all embodiments the production process of the different parts or layers may be performed as described before.

Figure 15:
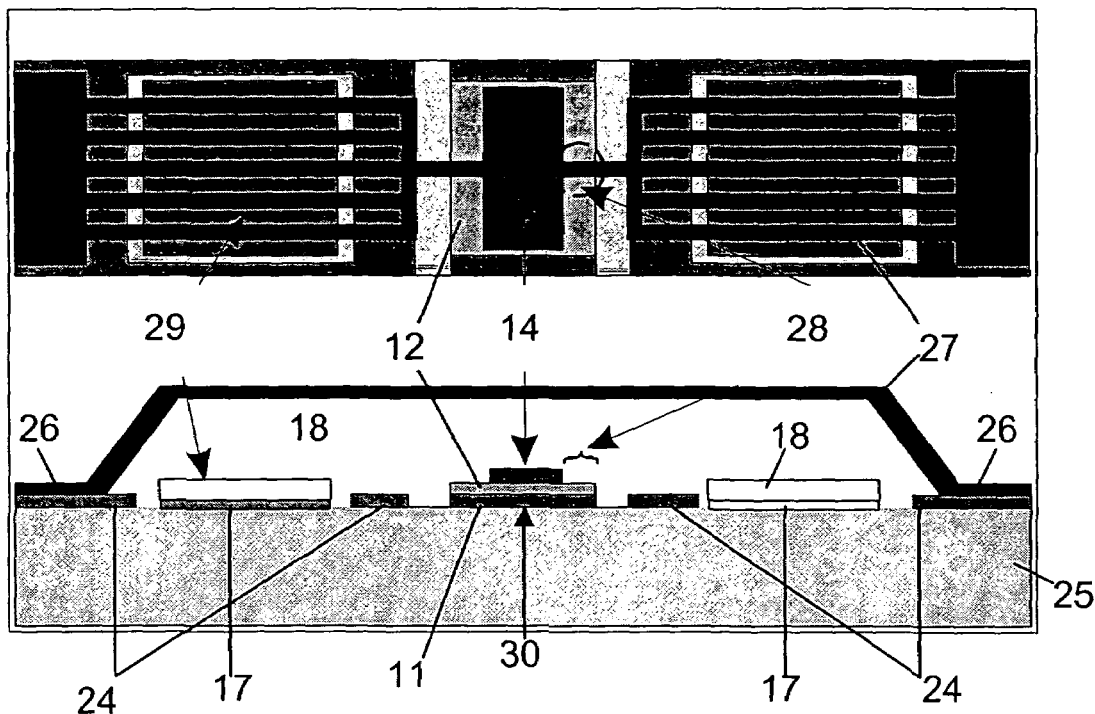
FIGS. 15–16 and 18, 19, 20, 21, 22, 23, 24 and 25 show RF MEMS capacitive switch structures according to different embodiments of the invention.

An embodiment of the present invention is depicted in FIG. 15. The architecture of the device is similar to that of FIG. 13 and FIG. 14, but the actuation electrodes 17 may comprise a different conductive material than that of the bottom electrode 11. Furthermore, the dielectric material 18 on top of the actuation electrodes 17 may be different from the dielectric layer 12 that is covering the bottom electrode 11. Also the thickness of the different layers and stacks of layers may be different.

Figure 16:
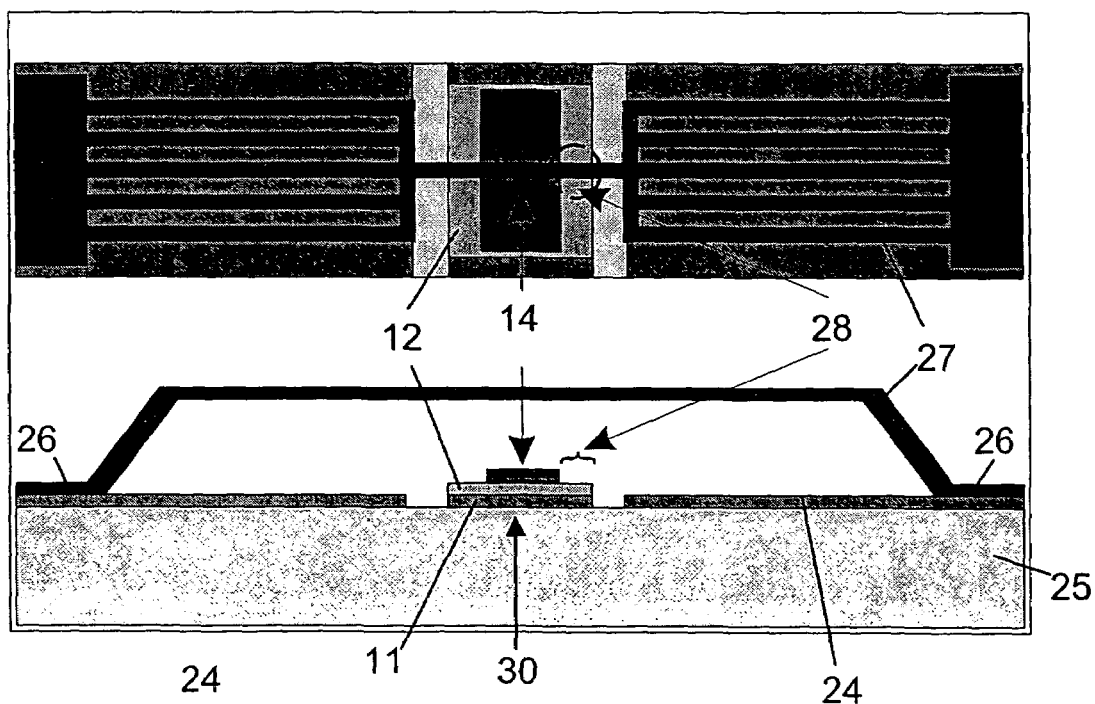
Figure 17:
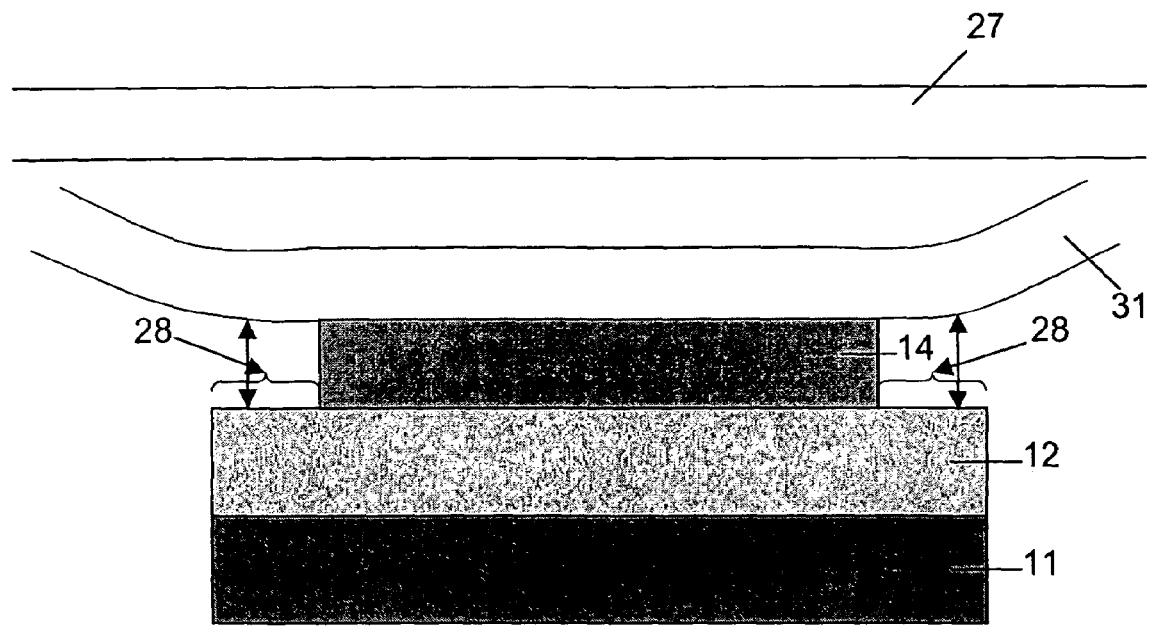
FIG. 17 is a schematic representation of a further embodiment of the present invention.

In FIG. 16 another embodiment of the present invention is depicted. The device 10 comprises an armature which has the shape of a bridge 27. Down state actuation is performed by the areas adjacent to the floating electrode 14, part of the switch capacitance. There are no actuation electrodes 17 present. Hence, only the first actuation area 28 is present with respect to the previous embodiments. Because of the presence of the first actuation area 28, this embodiment provides the advantage of allowing the bridge 27 to stay down after touching the floating electrode 14. This is one of the advantages of the invention over older devices wherein the first actuation area 28 is not present and hence the bridge 27 will turn back to the up state position as soon as it has touched the floating electrode 14. This may be explained with respect to FIG. 17. The bridge 27 needs charge to stay in the down state position. As in WO 02/01584, no first actuation area 28 is present, charging of the metal cap will reduce the force exercised on the bridge 27. Hence, the bridge 27 bounces back to the up state position. In this embodiment of the present invention, the charging of the floating electrode 14 will also reduce the force on the deformed bridge 31, but in the first actuation area 28 this force, which is indicated by the arrows, remains and hence the bridge 27 stays in the down state position.

Figure 18:
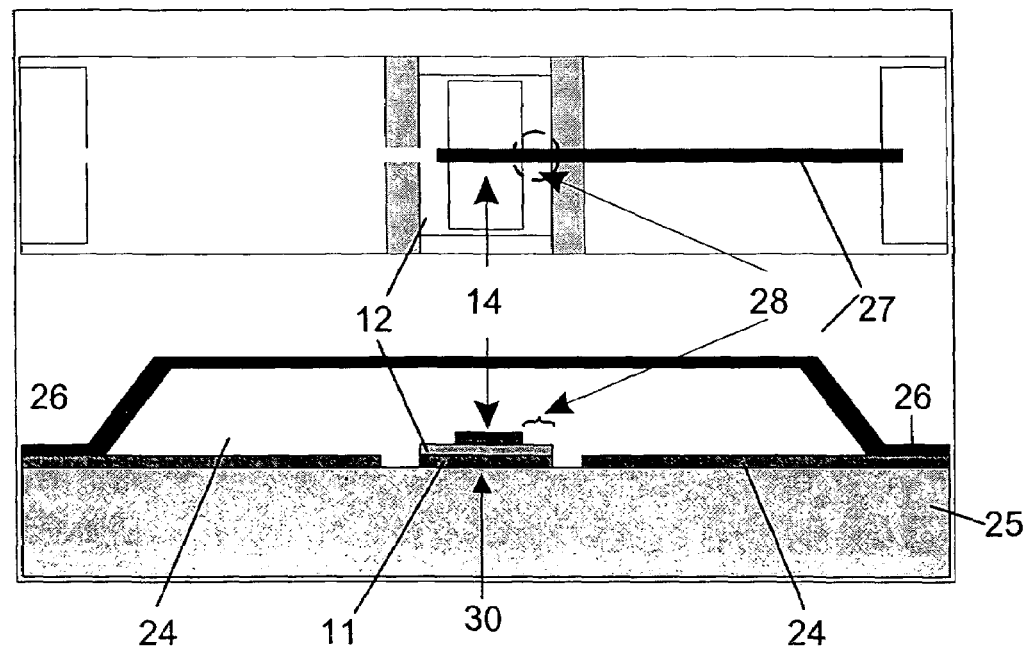

Yet another embodiment of the present invention is depicted in FIG. 18. The device is similar to that of FIG. 16, but the bridge 27 may have a less complex shape (top drawing of FIG. 18). Again, no actuation electrodes 17 and hence only the first actuation area 28 is present in the device 10 of this embodiment. This embodiment illustrates how the overlap between the bridge 27 and the floating electrode 14 may be made as small as possible, e. g., smaller than for example 5 $\mu$m, in order to reduce the up state capacitance (e. g. <10 cF) and hence to increase the capacitance ratio from (eq. 5).

Figure 19:
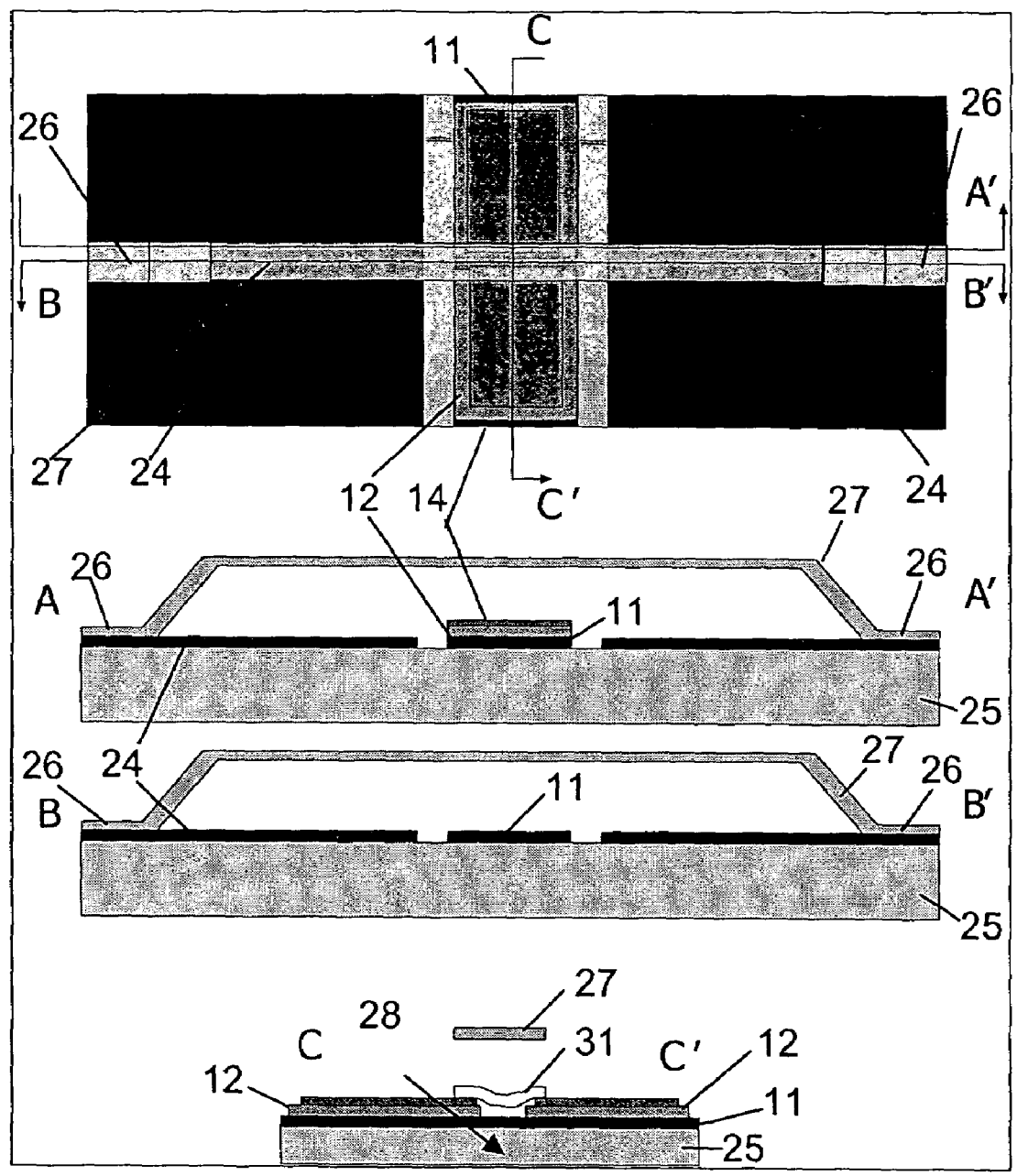

Still another embodiment of the present invention is depicted in FIG. 19. The device may have a bridge 27 architecture and down state actuation may be performed by the first actuation areas 28, which are adjacent to the floating electrode 14, part of the switch capacitance. There are no actuation electrodes 17, and hence no second actuation area 29. In this embodiment the floating electrode 14 may comprise two parts C and C'. Between the two parts C and C' the dielectric layer 12 may be interrupted. An advantage of interrupting the dielectric layer 12 is that the floating electrode 14 may be used as a mask to etch the dielectric layer 14, thereby reducing the number of masking steps necessary during the processing of the device 10 of the present invention. Furthermore, if no floating electrode 14 is present above the dielectric layer 12, the dielectric layer 12 may be charged due to the actuation voltage. Therefore, the dielectric layer 12 may be interrupted at the location where no floating electrode 14 is present. Hence, the dielectric material then present comprises vacuum, which does not charge very easily. The bridge 27 in this embodiment may have the same shape as in the previous embodiment (FIG. 18), hence the overlap between the bridge 27 and the floating electrode 14 is small and thus the up state capacitance is small too, preferably smaller than 10 cF. Reference number 31 in FIG. 19 represents the bridge in deformed state.

Figure 20:
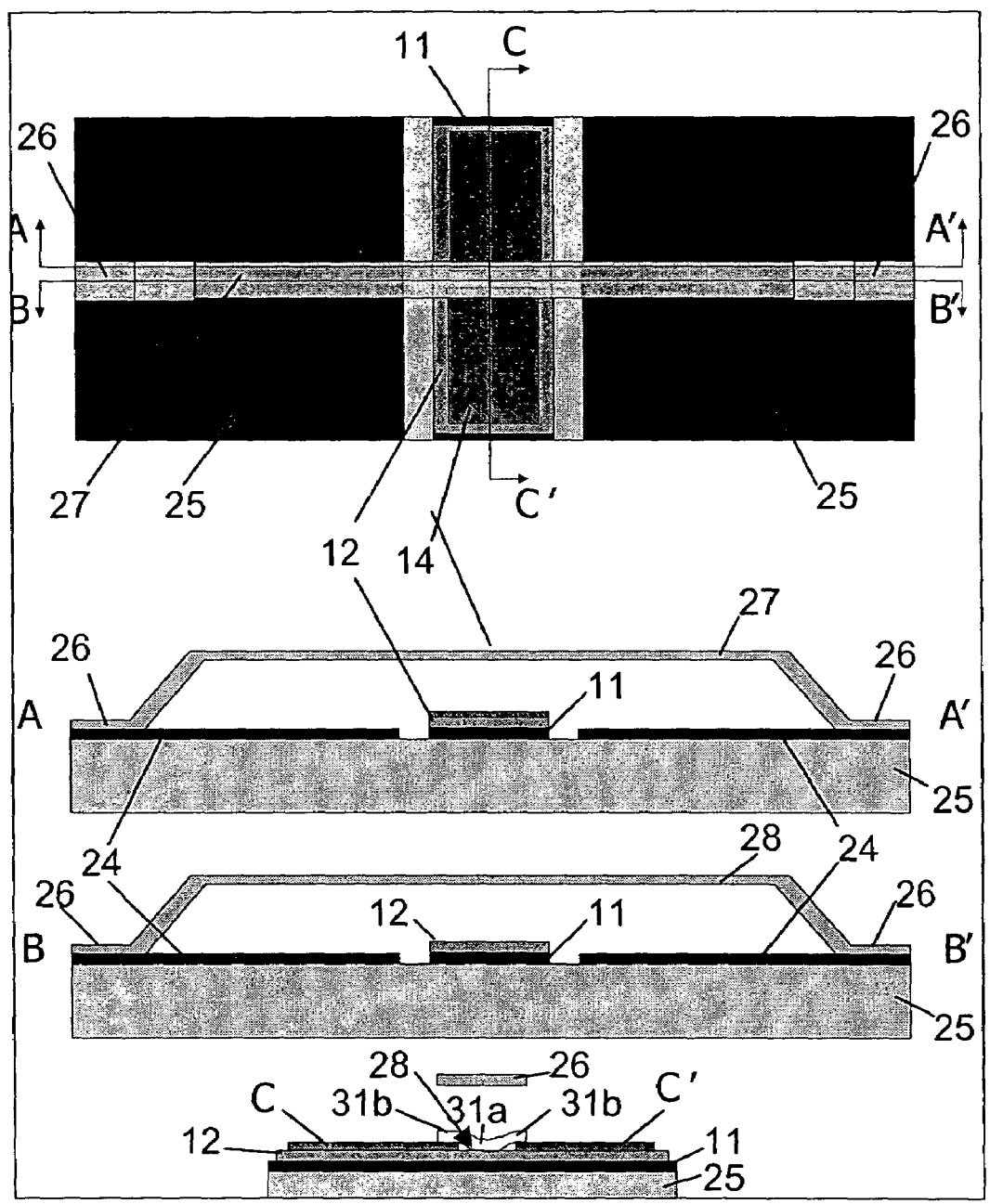

A further embodiment of the present invention is depicted in FIG. 20. This embodiment is similar to the previous embodiment (FIG. 19). The device may have a bridge 27 architecture and down state actuation may be performed by the first actuation area 28, adjacent to the floating electrode 14, part of the switch capacitance. There are no actuation electrodes 17 and hence no second actuation area 29. Again, the floating electrode 14 may comprise two parts C and C' and the bridge 27 may have the same shape as in the two previous embodiments. Hence, the up state capacitance is small (preferably <10 cF), and the down/up capacitance ratio is increased. The difference between this embodiment and the previous one is the presence of dielectric layer 12 between the two parts C and C'. The force exercised on the bridge 27 is decreased in the areas 31$b$ due to charging of the floating electrode 14. Between C and C', in the area 31$a$ the force remains and hence the bridge 27 will stay in the down state position. In this embodiment, it is desirable to use a dielectric layer 12 which does not charge easily. Otherwise, if the dielectric layer 12 is charged due to the actuation voltage, the force exercised on the bridge 27 will be reduced and the bridge 27 may bounce back to the up state positon.

In the above embodiments, the device 10 of the present invention comprises an armature which has the shape of a bridge 27. Hence, the above described devices 10 include shunt switches. In the hereinafter described embodiments, the armature may have the shape of a cantilever 32 and thus in the following embodiments, series switches are discussed.

Figure 21:
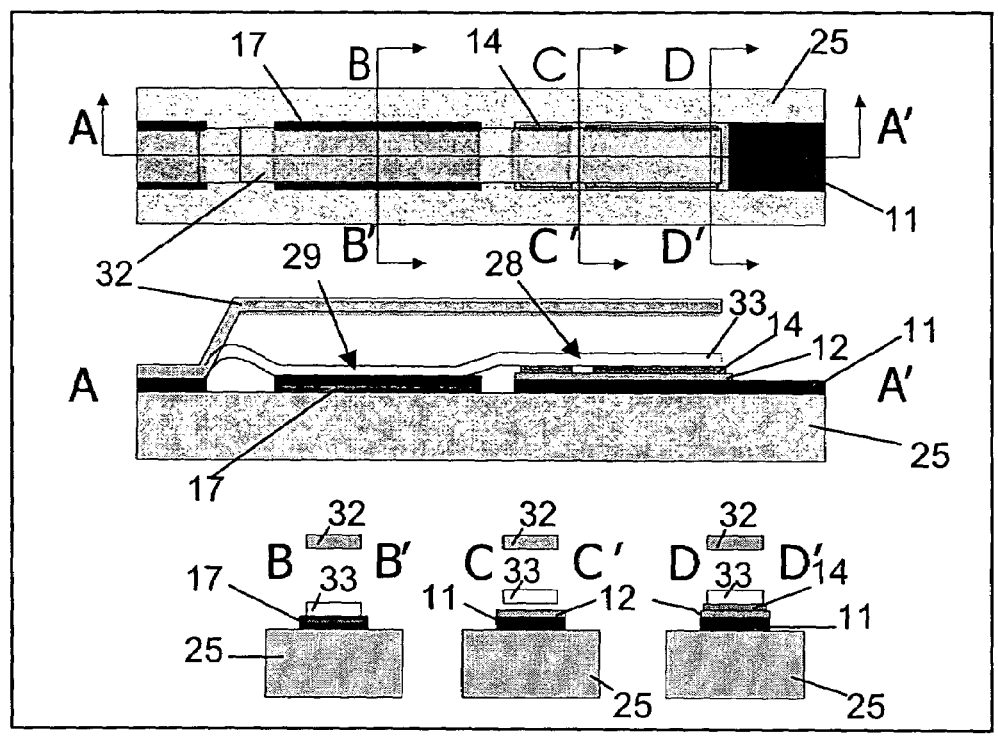

An embodiment of the present invention is depicted in FIG. 21. The armature may have the shape of a cantilever 32. Down state actuation may be performed by the first actuation area 28 adjacent to the floating electrode 14 and/or by one actuation electrode 17, and thus the second actuation area 29. Both actuation electrode 17 and floating electrode 14 may be situated under the cantilever 32. Reference number 33 represents the cantilever 32 in the deformed state.

Figure 22:
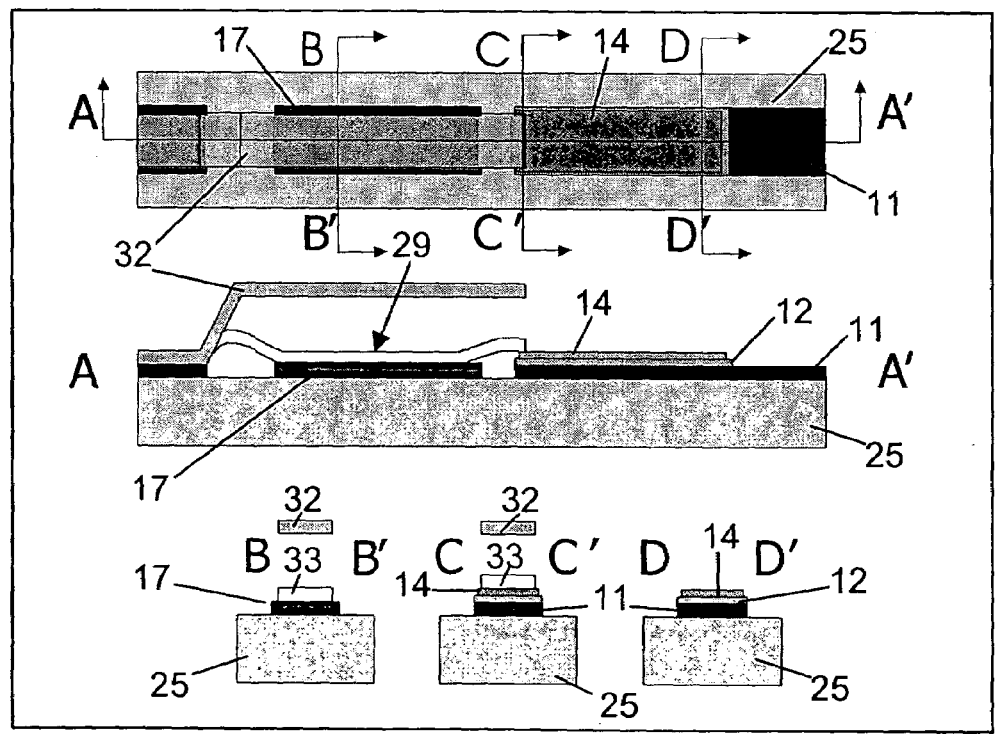

In a further embodiment of the present invention, which is depicted in FIG. 22, the overlap between the floating electrode 14 and the cantilever 32 may be made as small as possible (e. g. <5 μm) in order to decrease $C_{up}$ (e. g. <10 cF) and only the actuation electrode 17 may be situated under the cantilever 32. Down state actuation may be performed by one actuation electrode 17. Only the second actuation area 29 is present. This is different from the previous embodiment, where actuation may be performed by both the first 28 and the second 29 actuation area.

Figure 23:
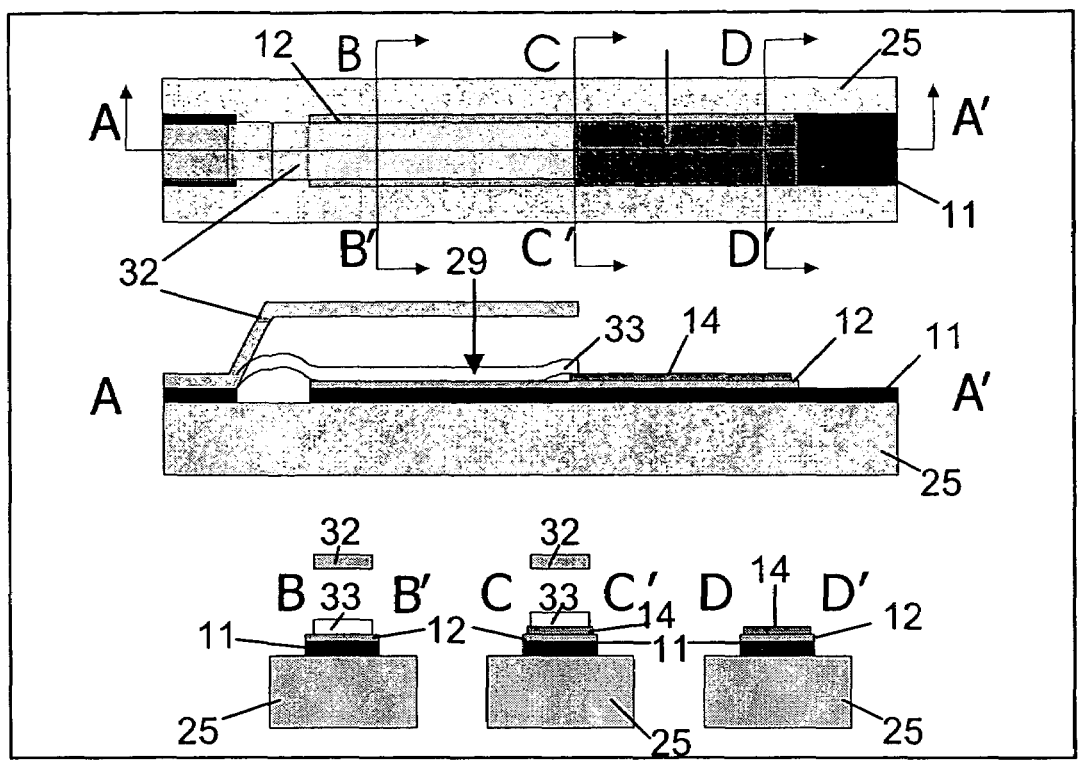

Another embodiment of the present invention is depicted in FIG. 23. The device may have a cantilever 32 architecture and down state actuation may be performed by the first actuation area 28 adjacent to the floating electrode 14, situated under the cantilever 32. The overlap between the floating electrode 14 and the cantilever 32 may be made as small as possible, preferably smaller than 5 μm, again to make the upstate capacitance as close to zero as possible (preferably <10 cF). No actuation electrode 17 is present. The first actuation area 28 may much larger with respect to the previous embodiments. In this embodiment, the down state position of the cantilever 32 may be very stable for reasons already explained with respect to FIG. 17.

Figure 24:
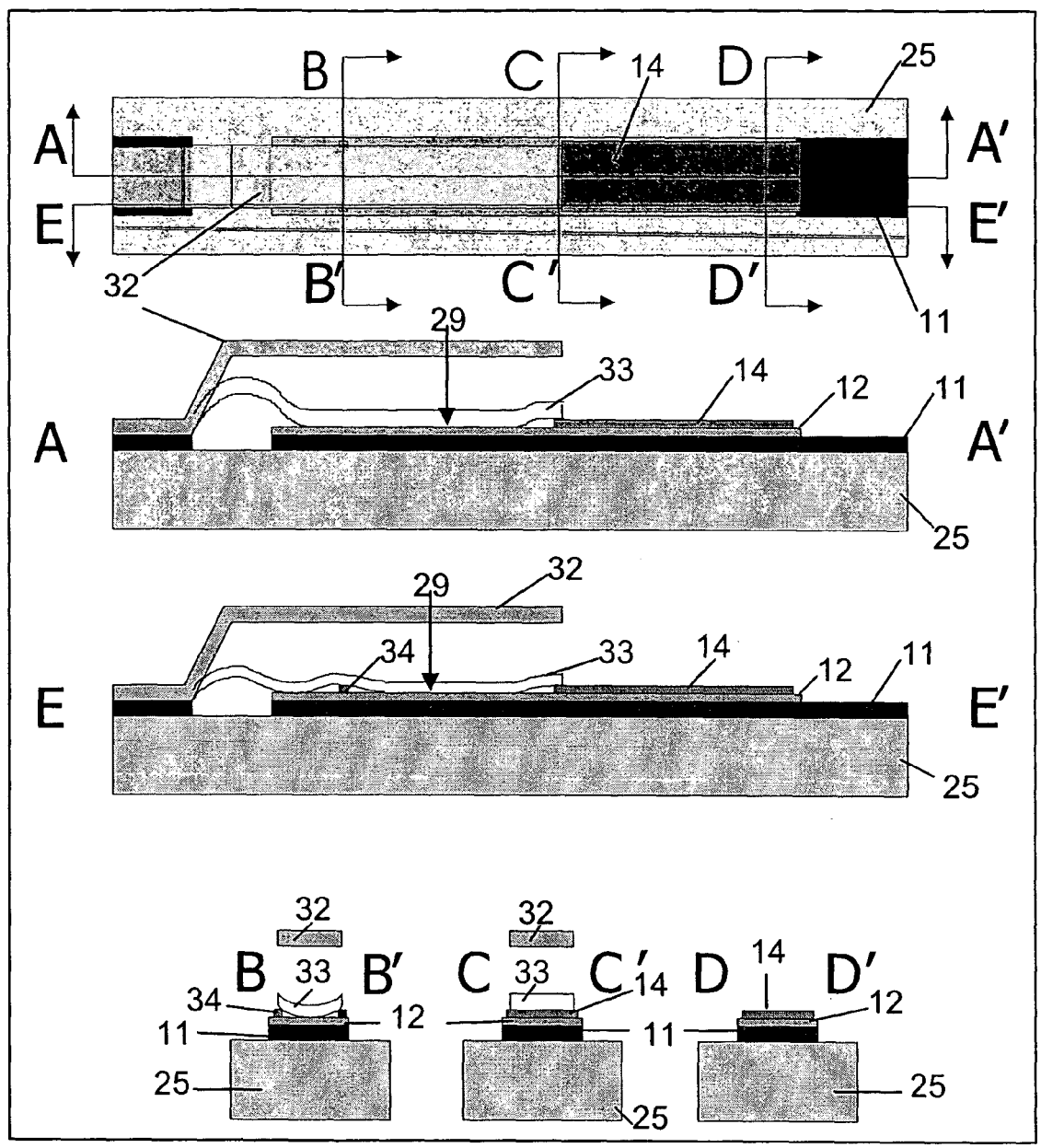

Still another embodiment of the present invention is depicted in FIG. 24. The device is similar to the device of FIG. 23, but additionally a superincumbent island 34 of a conductive material may be deposited onto a portion of the dielectric layer 12 which is not covered with the floating electrode 14, in order to reduce or avoid stiction. The superincumbent island 34 may comprise for example a metal such as Cu, Al, Au or may be any other suitable conductive material.

Figure 25:
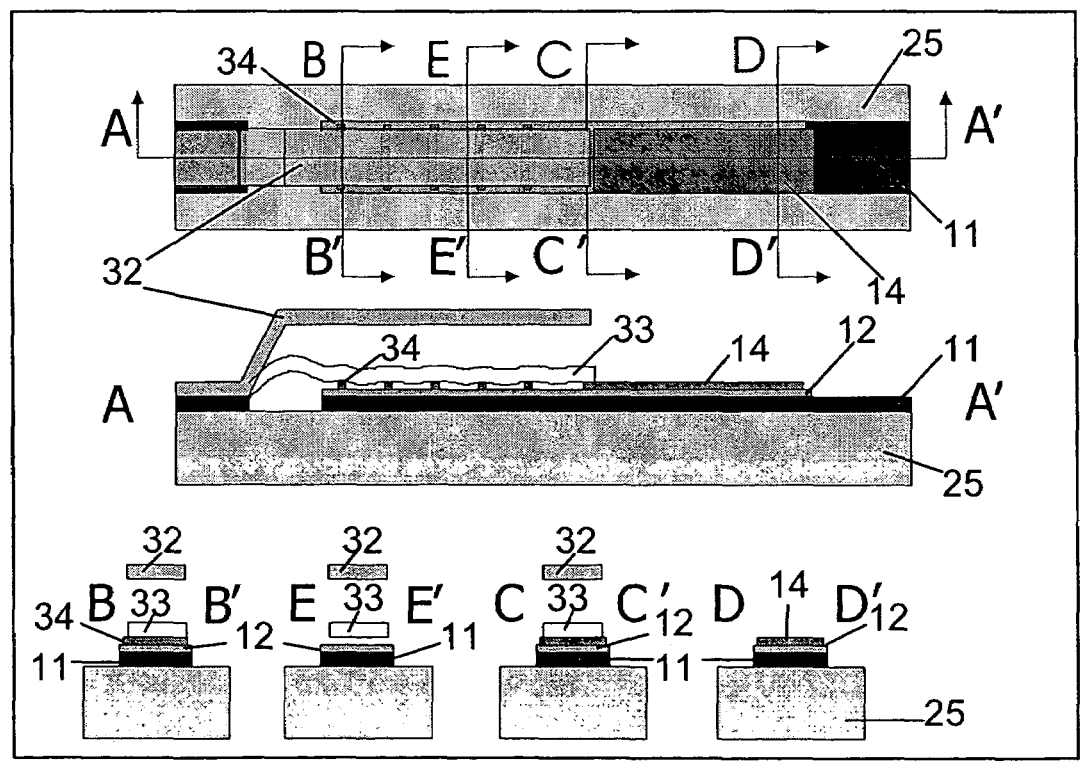

A further embodiment of the present invention is depicted in FIG. 25. The device is similar to FIG. 24, but now more than one superincumbent island 34 comprising a conductive material, such as for example Cu, Al, Au, or any other suitable conductive material, may be present. The different superincumbent islands 34 may be of different shapes and formed out of different materials.

In another embodiment (not shown in the figures) the down surface of the cantilever 32 may comprise at least one elevated island in order to reduce stiction between the cantilever 32 and the floating electrode.

In still another embodiment of the present invention, which is not illustrated in the figures, the floating electrode 14 may be embedded or encapsulated within the dielectric layer 12.

It is to be understood that although preferred embodiments, specific constructions and configurations, as well as materials, have been discussed herein for devices according to the present invention, various changes or modifications in form and detail may be made without departing from the scope and spirit of this invention. Accordingly, the description of preferred embodiments should not be deemed to limit the scope of the present invention.

What is claimed is:

1. A micro electromechanical switchable capacitor comprising:
   a bottom electrode;
   a dielectric layer deposited on at least a portion of said bottom electrode;
   a conductive floating electrode deposited on at least a portion of said dielectric layer;
   an armature positioned to form a first overlap region with said floating electrode, said first overlap region comprising the projection of the armature onto the floating electrode along a direction substantially perpendicular to the plane of the bottom electrode;
   a first actuation area comprising at least a portion of a second overlap region between said armature and an uncovered portion of said bottom electrode, wherein said second overlap region comprises a projection of said armature onto said bottom electrode along a direction substantially perpendicular to the plane of the bottom electrode.

2. A capacitor according to claim 1, further comprising at least one actuation electrode and a second actuation area, wherein said second actuation area comprises an overlap area between said armature and said at least one actuation electrode, and said overlap area comprises a projection of said armature onto said bottom electrode in a direction substantially perpendicular to the plane of the bottom electrode.

3. A capacitor according to claim 1, wherein at least one of a width and length of said first overlap region between said floating electrode and said armature is at most 5 μm.

4. A capacitor according to claim 1, wherein said armature comprises first and second sides opposite to each other and located in a plane substantially perpendicular to the plane of the bottom electrode, and wherein said armature is located such that a first portion of the floating electrode is positioned at the first side of the armature and a second portion of the floating electrode is positioned at the second side of the armature.

5. A capacitor according to claim 1, wherein said armature comprises one of a bridge and a cantilever.

6. A capacitor according to claim 1, further comprising an up state actuation area and a down state actuation area.

7. A capacitor according to claim 6, wherein said up state actuation area comprises at least one of (a) the second overlap region between said armature and said bottom electrode, and (b) the second actuation area.

8. A capacitor according to claim 6, wherein said down state actuation area comprises one of (a) the first actuation area, and (b) the second actuation area.

9. A capacitor according to claim 1, wherein the capacitor is characterized by an up state capacitance that is a function of the second overlap region between said armature and said bottom electrode.

10. A capacitor according to claim 9, wherein said up state capacitance is proportional to the second overlap region between said armature and said bottom electrode.

11. A capacitor according to claim 1, wherein said up state capacitance is made smaller than 10 centifarad by reducing the second overlap region between the armature and the bottom electrode.

12. A capacitor according to claim 1, wherein the capacitor is characterized by a down state capacitance that is a function of an overlap area between said floating electrode and said bottom electrode, said overlap area comprising a projection of the floating electrode onto the bottom electrode in a direction substantially perpendicular to the plane of the bottom electrode.

13. A capacitor according to claim 12, wherein said down state capacitance is proportional to the overlap area between said floating electrode and said bottom electrode.

14. A capacitor according to claim 1, wherein said floating electrode comprises unconnected regions.

15. A capacitor according to claim 14, wherein each of said unconnected regions comprises an overlap with said armature, said overlap comprising a projection of the armature onto the unconnected region along a direction substantially perpendicular to the plane of the bottom electrode.

16. A capacitor according to claim 1, wherein at least one island of conductive material is deposited onto said dielectric layer, and wherein said at least one island comprises a contact region between said armature and said dielectric layer.

17. A capacitor according to claim 1, wherein the armature comprises an up and a down surface positioned opposite to each other in a plane substantially parallel to the plane of the bottom electrode, said down surface of said armature comprising at least one elevated island of conductive material, and wherein said elevated island comprises a contact region between said armature and dielectric layer.

18. A capacitor according to claim 1, wherein said floating electrode is embedded or encapsulated within said dielectric layer.

19. A capacitor according to claim 1, wherein at least one of said dielectric layer, said floating gate, and said armature comprises a plurality of holes.

* * * * *